(12) United States Patent
Yasukawa

(10) Patent No.: US 11,916,021 B2
(45) Date of Patent: Feb. 27, 2024

(54) SEMICONDUCTOR DEVICE, ELECTRONIC MODULE AND ELECTRONIC APPARATUS EACH HAVING STACKED EMBEDDED ACTIVE COMPONENTS IN A MULTILAYER WIRING BOARD

(71) Applicant: SONY GROUP CORPORATION, Tokyo (JP)

(72) Inventor: Hirohisa Yasukawa, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/736,587

(22) Filed: May 4, 2022

(65) Prior Publication Data

US 2022/0262737 A1 Aug. 18, 2022

Related U.S. Application Data

(63) Continuation of application No. 16/078,803, filed as application No. PCT/JP2017/001870 on Jan. 20, 2017, now Pat. No. 11,355,444.

(30) Foreign Application Priority Data

Mar. 1, 2016 (JP) .................................. 2016-039329

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 21/486* (2013.01);
(Continued)

(58) Field of Classification Search
CPC ............. H01L 23/5389; H01L 21/4857; H01L 21/486; H01L 23/49816; H01L 23/49822;
(Continued)

(56) References Cited

U.S. PATENT DOCUMENTS 9,524,959 B1 * 12/2016 Yeh ....................... H01L 21/486
2003/0227095 A1 12/2003 Tetsuya et al.
(Continued)

FOREIGN PATENT DOCUMENTS

CN 101131970 A 2/2008
CN 102034799 A 4/2011
(Continued)

OTHER PUBLICATIONS

International Search Report and Written Opinion for International (PCT) Patent Application No. PCT/JP2017/001870, dated Mar. 21, 2017, 11 pages.
(Continued)

*Primary Examiner* — Michael Jung
(74) *Attorney, Agent, or Firm* — Sheridan Ross PC

(57) ABSTRACT

To provide a semiconductor device further reduced in size. A semiconductor device including: a multilayer wiring board one surface of which is provided with an external connection terminal; and a plurality of active components that are provided to be stacked inside the multilayer wiring board and are connected to the external connection terminal via a connection via. The plurality of active components include a first active component provided on another surface side that is opposite to the one surface, and a second active component that is provided closer to the one surface than the first active component is and has a smaller planar area than the first active component.

19 Claims, 34 Drawing Sheets

(51) Int. Cl.
*H01L 23/498* (2006.01)
*H01L 25/065* (2023.01)

(52) U.S. Cl.
CPC .. *H01L 23/49816* (2013.01); *H01L 23/49822* (2013.01); *H01L 23/49838* (2013.01); *H01L 23/5383* (2013.01); *H01L 23/5386* (2013.01); *H01L 25/0657* (2013.01); *H01L 2225/06548* (2013.01)

(58) Field of Classification Search
CPC ........... H01L 23/49838; H01L 23/5383; H01L 23/5386; H01L 25/0657
See application file for complete search history.

(56) References Cited

U.S. PATENT DOCUMENTS

| | | | |
|---|---|---|---|
| 2006/0013056 A1* | 1/2006 | Thompson | G11C 5/063 365/230.03 |
| 2009/0071705 A1 | 3/2009 | Moon-Il et al. | |
| 2009/0188703 A1* | 7/2009 | Ito | H01L 24/18 174/255 |
| 2009/0316373 A1* | 12/2009 | Kim | H01L 23/5389 361/764 |
| 2010/0242272 A1 | 9/2010 | Moon-Il et al. | |
| 2011/0084382 A1 | 4/2011 | Wei-Ming et al. | |
| 2013/0037950 A1 | 2/2013 | Yu et al. | |
| 2013/0040423 A1 | 2/2013 | Tung et al. | |
| 2013/0069245 A1 | 3/2013 | Kenta et al. | |
| 2016/0005715 A1* | 1/2016 | Fazelpour | H01L 23/5385 257/713 |
| 2016/0066428 A1 | 3/2016 | Shigeru et al. | |
| 2016/0240492 A1 | 8/2016 | Wolter et al. | |
| 2016/0358889 A1* | 12/2016 | Lai | H01L 21/768 |
| 2021/0183782 A1 | 6/2021 | Yasukawa | |

FOREIGN PATENT DOCUMENTS

| | | |
|---|---|---|
| JP | 2004-056093 | 2/2004 |
| JP | 2004-072032 | 3/2004 |
| JP | 2006-216770 | 8/2006 |
| JP | 2007318059 A | 12/2007 |
| JP | 2009-076833 | 4/2009 |
| JP | 2009-164653 | 7/2009 |
| JP | 2013-069808 | 4/2013 |
| WO | WO 2014/185204 | 11/2014 |

OTHER PUBLICATIONS

Official Action for U.S. Appl. No. 16/078,803, dated Jun. 21, 2021, 23 pages.
Official Action for U.S. Appl. No. 16/078,803, dated Nov. 4, 2021, 15 pages.
Notice of Allowance for U.S. Appl. No. 16/078,803, dated Feb. 7, 2022, 9 pages.

* cited by examiner

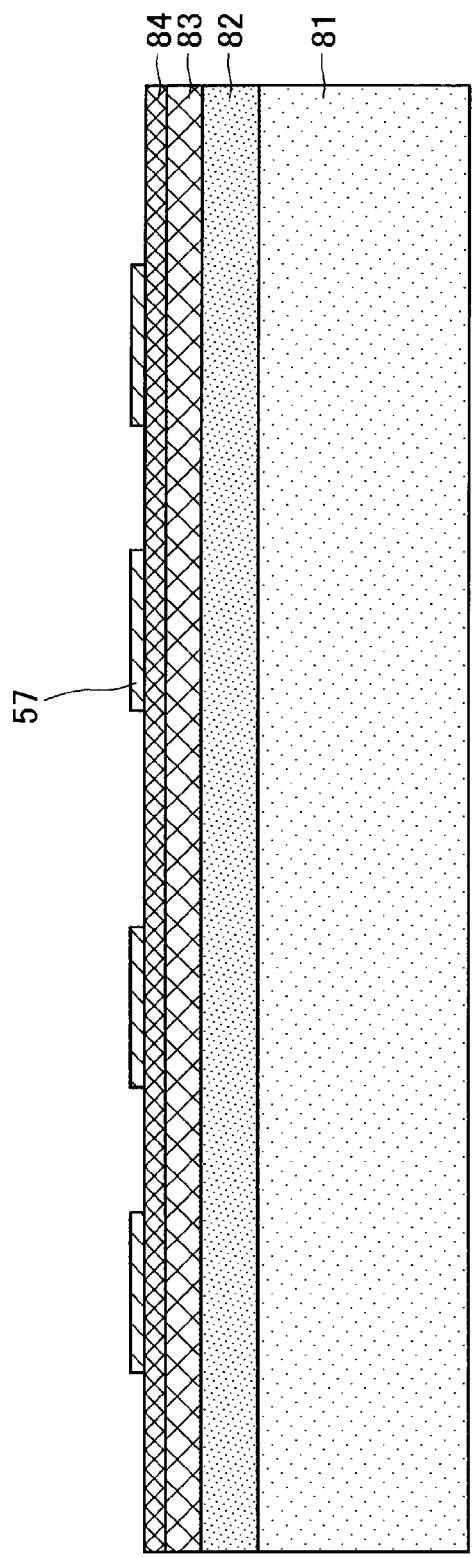

SEMICONDUCTOR DEVICE, ELECTRONIC MODULE AND ELECTRONIC APPARATUS EACH HAVING STACKED EMBEDDED ACTIVE COMPONENTS IN A MULTILAYER WIRING BOARD

CROSS REFERENCE TO RELATED APPLICATIONS

This application is a continuation of U.S. patent application Ser. No. 16/078,803 filed 22 Aug. 2018, which is a national stage application under 35 U.S.C. 371 and claims the benefit of PCT Application No. PCT/JP2017/001870 having an international filing date of 20 Jan. 2017, which designated the United States, which PCT application claimed the benefit of Japanese Patent Application No. 2016-039329 filed 1 Mar. 2016, the entire disclosures of each of which are incorporated herein by reference.

TECHNICAL FIELD

The present disclosure relates to a semiconductor device, an electronic module, an electronic apparatus, and a method for producing a semiconductor device.

BACKGROUND ART

In recent years, electronic apparatuses, such as a mobile phone, a personal digital assistant (PDA), and a notebook personal computer, have been reduced in size and improved in performance. Therefore, semiconductor devices incorporated in these electronic apparatuses have been required to adapt to higher-density mounting.

In order to adapt to high-density mounting, it is required that terminals and wiring patterns be made finer and semiconductor devices be reduced in size. For example, in recent years, a system-on-a-chip (SoC) technology in which a semiconductor device is reduced in size by integrating a plurality of functional circuits to form a system circuit on one chip has been proposed.

In addition, Patent Literature 1 below proposes a system-in-package (SiP) technology in which a semiconductor device is reduced in size in the following manner: a plurality of electronic components are installed on a substrate and electrically connected by wire bonding and then sealed with a mold resin. Furthermore, Patent Literature 2 below proposes a substrate having components built in in which an electronic component is built in an organic substrate and electrical connection from the electronic component to a surface of the organic substrate is formed by a connection via.

CITATION LIST

Patent Literature

Patent Literature 1: JP 2009-164653A
Patent Literature 2: JP 2004-072032A

DISCLOSURE OF INVENTION

Technical Problem

However, with the above technologies, it is difficult to further reduce the size of the semiconductor device. Specifically, in the technology disclosed in Patent Literature 1, the installed plurality of electronic components are connected to each other by wire bonding, which requires a region where wire bonding is provided. In addition, with the technology disclosed in Patent Literature 2, it is difficult to stack electronic components; thus, an electronic component arrangement area increases in the case where a plurality of electronic components are used.

Hence, the present disclosure proposes a semiconductor device further reduced in size, an electronic module including the semiconductor device, an electronic apparatus including the semiconductor device, and a method for producing the semiconductor device.

Solution to Problem

According to the present disclosure, there is provided a semiconductor device including: a multilayer wiring board one surface of which is provided with an external connection terminal; and a plurality of active components that are provided to be stacked inside the multilayer wiring board and are connected to the external connection terminal via a connection via. The plurality of active components include a first active component provided on another surface side that is opposite to the one surface, and a second active component that is provided closer to the one surface than the first active component is and has a smaller planar area than the first active component.

In addition, according to the present disclosure, there is provided an electronic module including a semiconductor device including a multilayer wiring board one surface of which is provided with an external connection terminal, and a plurality of active components that are provided to be stacked inside the multilayer wiring board and are connected to the external connection terminal via a connection via. The plurality of active components provided in the semiconductor device include a first active component provided on another surface side that is opposite to the one surface, and a second active component that is provided closer to the one surface than the first active component is and is smaller than the first active component.

In addition, according to the present disclosure, there is provided an electronic apparatus including a semiconductor device including a multilayer wiring board one surface of which is provided with an external connection terminal, and a plurality of active components that are provided to be stacked inside the multilayer wiring board and are connected to the external connection terminal via a connection via. The plurality of active components provided in the semiconductor device include a first active component provided on another surface side that is opposite to the one surface, and a second active component that is provided closer to the one surface than the first active component is and is smaller than the first active component.

In addition, according to the present disclosure, there is provided a method for producing a semiconductor device, including: a step of forming a multilayer wiring board by stacking a plurality of active components on a support substrate while embedding the plurality of active components in an insulating resin; a step of forming a connection via to be connected to each of the plurality of active components; a step of forming an electrode pad to be connected to the connection via on a surface of the multilayer wiring board; and a step of forming an external connection terminal on the electrode pad. The plurality of active components include a first active component stacked on the support substrate side and a second active component that is stacked on a surface side where the external connection terminal is formed and has a larger planar area than the first active component.

According to the present disclosure, a plurality of active components can be arranged efficiently inside a semiconductor device, which can improve utilization efficiency of an interior space of the semiconductor device.

Advantageous Effects of Invention

As described above, according to the present disclosure, a semiconductor device further reduced in size can be provided.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 16 is a schematic cross-sectional diagram for describing a step of a method for producing the semiconductor device according to the first advanced example.

FIG. 17 is a schematic cross-sectional diagram for describing a step of a method for producing the semiconductor device according to the first advanced example.

MODE(S) FOR CARRYING OUT THE INVENTION

Figure 1:
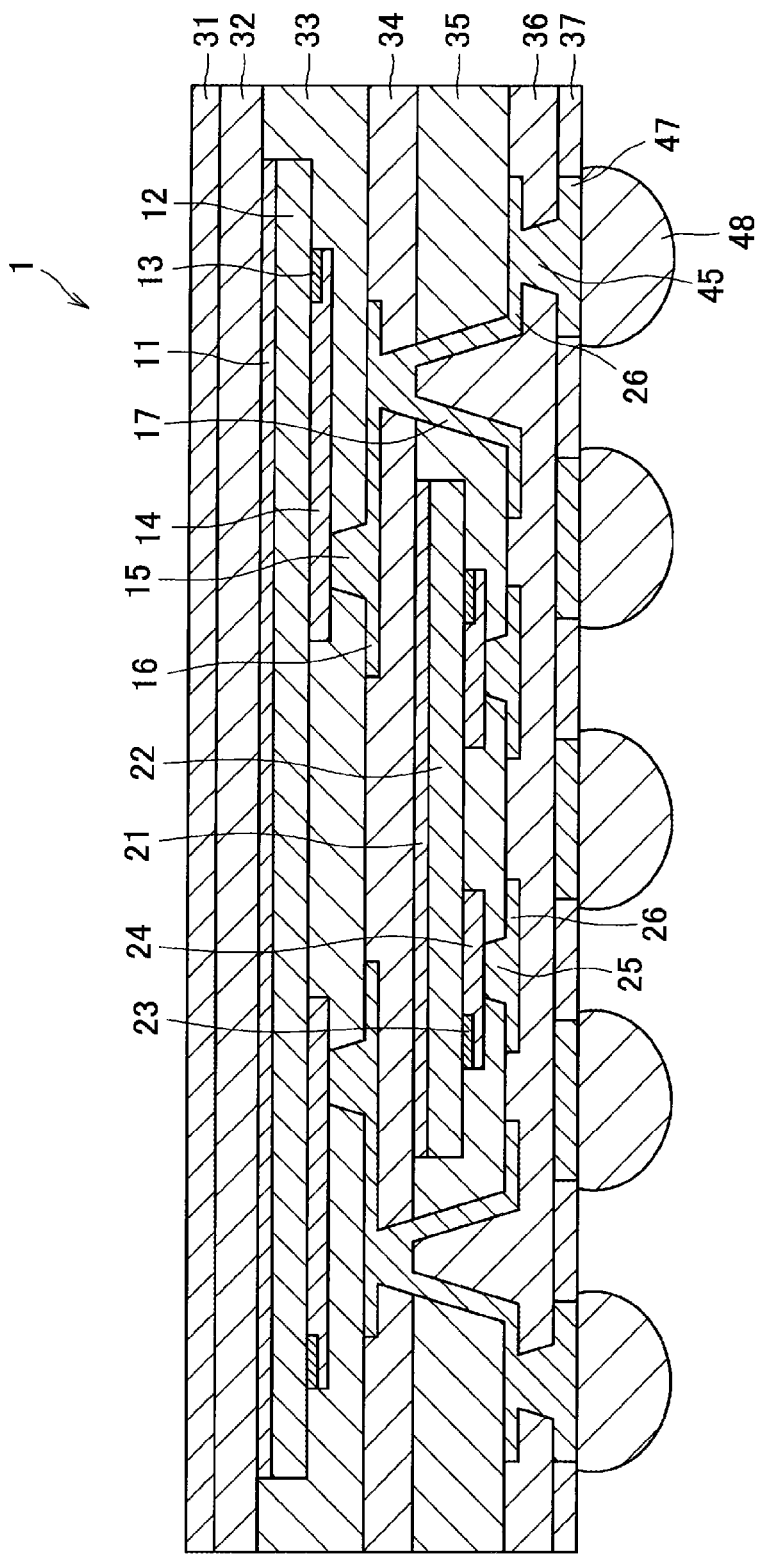
FIG. 1 is a cross-sectional diagram schematically illustrating a cross-sectional structure of a semiconductor device according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description is given in the following order.
1. First Embodiment
1.1. Configuration example of semiconductor device
1.2. Effect provided by semiconductor device
1.3. Advanced examples
1.4. Method for producing semiconductor device
2. Second Embodiment
2.1. Configuration example of electronic module
2.2. Modified example
3. Third Embodiment
3.1. Overview of electronic apparatus
3.2. Configuration example of electronic apparatus
4. Conclusion 1. First Embodiment 1.1. Configuration Example of Semiconductor Device First, a configuration example of a semiconductor device according to a first embodiment of the present disclosure is described with reference to FIG. 1. FIG. 1 is a cross-sectional diagram schematically illustrating a cross-sectional structure of the semiconductor device according to the present embodiment.

As illustrated in FIG. 1, a semiconductor device 1 includes an external connection terminal 48 provided on one surface, and a first active component 12 and a second active component 22 built in the semiconductor device 1 in a state of being stacked. In addition, the semiconductor device 1 includes a multilayer wiring board in which interlayer insulating films 32, 33, 34, 35, and 36 are stacked, and protective layers 31 and 37 are provided on surfaces of the semiconductor device 1.

That is, the semiconductor device 1 includes a multilayer wiring board in which the protective layer 37, the interlayer insulating film 36, the interlayer insulating film 35, the interlayer insulating film 34, the interlayer insulating film 33, the interlayer insulating film 32, and the protective layer 31 are stacked in this order from the one surface side where the external connection terminal 48 is provided.

The interlayer insulating films 32, 33, 34, 35, and 36 are main members of the multilayer wiring board constituting the semiconductor device 1, and electrically insulate the first active component 12, the second active component 22, and metal wiring embedded in the interlayer insulating films from each other. The interlayer insulating films 32, 33, 34, 35, and 36 include an organic resin with insulating properties, and may include, for example, an epoxy resin, a polyimide resin, a modified polyphenylene ether (PPE) resin, a phenol resin, a polytetrafluoroethylene (PTFE) resin, a silicon resin, a polybutadiene resin, a polyester resin, a melamine resin, a urea resin, a polyphenylene sulfide (PPS) resin, a polyphenylene oxide (PPO) resin, and the like. In addition, one type of these organic resins may be used alone, or a plurality of types may be mixed or reacted for use. In addition, the interlayer insulating films 32, 33, 34, 35, and 36 may contain a reinforcing material such as an inorganic filler or glass fiber in order to improve strength or insulating properties.

The protective layers 31 and 37 are provided in a region other than a contact for electrical connection on both surfaces of the semiconductor device 1 in order to protect the semiconductor device 1 from external environment. Specifically, the protective layers 31 and 37 are provided in a region other than a region where the external connection terminal 48 is provided on the both surfaces of the semiconductor device 1. The protective layers 31 and 37 may include, for example, a solder resist.

The external connection terminal 48 is electrically connected to the first active component 12 and the second active component 22 built in the semiconductor device 1, and functions as an input/output terminal to the first active component 12 and the second active component 22 from the outside. The external connection terminal 48 may be a solder ball constituting a ball grid array (BGA), a Cu-core solder ball for three-dimensional mounting such as package on package (POP), a Cu pillar bump obtained by capping columnar copper with solder, an electrode terminal constituting a land grid array (LGA), or the like.

The first active component 12 is electrically connected to the external connection terminal 48 via a terminal 13, a rewiring layer 14, a contact via 15, a wiring layer 16, a connection via 17, a wiring layer 26, a contact via 45, and an electrode pad 47. In addition, the first active component 12 is bonded to the interlayer insulating film 32 by a bonding layer 11, with its surface provided with a circuit or a terminal facing the surface side where the external connection terminal 48 is provided (downward in FIG. 1).

The first active component 12 is an active component built in the semiconductor device 1, and is provided in the interlayer insulating film 33 on the other surface side of the semiconductor device 1 that is opposite to the one surface provided with the external connection terminal 48. The first active component 12 is a component that performs active operation such as amplification or rectification of supplied electric power, and specifically may be a processor such as a micro processing unit (MPU), an integrated circuit element such as a power management integrated circuit (PMIC) and an authentication chip, a storage element such as a synchronous dynamic random access memory (SDRAM) and a flash memory, and the like.

The terminal 13 is an electrode or the like that performs input/output to the first active component 12, and includes, for example, a metal such as aluminum (Al). In addition, the terminal 13 is connected to the rewiring layer 14. The rewiring layer 14 is metal wiring routed from the terminal 13 for appropriate electrical connection with the wiring layer 16. The rewiring layer 14 may include, for example, a metal such as copper (Cu). In addition, in the rewiring layer 14 is formed a land that serves as a connection part with the contact via 15. This enables the contact via 15 to form electrical connection with the land of the rewiring layer 14 having a size relatively larger than that of the terminal 13, which is fine; thus, the contact via 15 can be formed more easily.

The bonding layer 11 fixes the first active component 12 by bonding the first active component 12 to the interlayer insulating film 32. Specifically, the bonding layer 11 may be an adhesive layer containing an ultraviolet curing resin or a thermosetting resin, and may be a die attach film, for example.

The contact via 15 is provided to penetrate the interlayer insulating film 33, and electrically connects the rewiring layer 14 to the wiring layer 16. The contact via 15 may include, for example, a metal such as Cu.

The wiring layer 16 is provided in the interlayer insulating film 34, and electrically connects the contact via 15 to the connection via 17. The wiring layer 16 may include, for example, a metal such as Cu.

In addition, the wiring layer 16 may be extended to between the first active component 12 and the second active component 22. Specifically, the wiring layer 16 may be extended to a region where the first active component 12 and the second active component 22 are provided to overlap each other in planar view of the semiconductor device 1 in a thickness direction. This enables the wiring layer 16 to function as an electromagnetic shield that prevents flow of an electromagnetic field between the first active component 12 and the second active component 22. Therefore, such a wiring layer 16 can prevent unwanted emission emitted by one of the first active component 12 and the second active component 22 from entering the other active component as noise. Particularly in the case where one of the first active component 12 and the second active component 22 is a PMIC or the like that is likely to emit noise, it is preferable to cause the wiring layer 16 to function as an electromagnetic shield.

The connection via 17 is provided to penetrate the interlayer insulating films 34 and 35, and electrically connects the wiring layer 16 to the wiring layer 26. The connection via 17 may include, for example, a metal such as Cu. Note that as will be described later, the connection via 17 is formed concurrently with the wiring layer 26, and thus is formed as a so-called conformal via whose interior is not filled.

The connection via 17 is provided in a projection region of the first active component 12 in a stacking direction to be isolated from the second active component 22 in order to ensure insulation from the second active component 22. An interval between the connection via 17 and the second active component 22 may be, for example, 100 µm. Thus, the connection via 17 can be formed with an efficient arrangement inside the semiconductor device 1, so that the semiconductor device 1 can be reduced in size. In addition, the connection via 17 may be provided perpendicularly to a board surface of the multilayer wiring board constituting the semiconductor device 1. In such a case, the connection via 17 can shorten a wiring length from the first active component 12 to the external connection terminal 48, and thus can reduce a loss due to parasitic capacitance and resistance variation in a transmission line.

The wiring layer 26 is provided in the interlayer insulating film 36, and electrically connects the connection via 17 to the contact via 45. The wiring layer 26 may include, for example, a metal such as Cu. In addition, the contact via 45 is provided to penetrate the interlayer insulating film 36, and electrically connects the wiring layer 26 to the electrode pad 47. The contact via 45 may include, for example, a metal such as Cu.

The electrode pad 47 is provided in an opening of the protective layer 37, and electrically connects the contact via 45 to the external connection terminal 48. The electrode pad 47 includes, for example, a metal such as copper (Cu). In addition, on a surface of the electrode pad 47 may be formed a film of a metal such as nickel (Ni) and gold (Au). The electrode pad 47 may include a single layer, or may have a stacked structure of a plurality of layers.

The second active component 22 is electrically connected to the external connection terminal 48 via a terminal 23, a rewiring layer 24, a contact via 25, the wiring layer 26, a contact via (not illustrated), and the electrode pad 47. In addition, the second active component 22 is bonded to the interlayer insulating film 34 by a bonding layer 21, with its surface provided with a circuit or a terminal facing the surface side where the external connection terminal 48 is provided (downward in FIG. 1).

The second active component 22 is an active component built in the semiconductor device 1, and is provided in the interlayer insulating film 35 on the surface side of the semiconductor device 2 where the external connection terminal 48 is provided. Like the first active component 12, the second active component 22 is a component that performs active operation such as amplification or rectification of supplied electric power, and specifically may be a processor such as an MPU, an integrated circuit element such as a PMIC and an authentication chip, a storage element such as a SDRAM and a flash memory, and the like.

Note that at least one of the first active component 12 and the second active component 22 is preferably a processor such as an MPU. In such a case, the semiconductor device 1 can function as an arithmetic processing device that executes predetermined information processing.

Here, the second active component 22 is an active component whose planar area is smaller than that of the first active component 12, and is provided in the projection region of the first active component 12 in the stacking direction. This enables a plurality of active components to be stacked with an efficient arrangement inside the semiconductor device 1.

The terminal 23 is an electrode or the like that performs input/output to the second active component 22, and includes, for example, a metal such as Al. In addition, the terminal 23 is connected to the rewiring layer 24. The rewiring layer 24 is metal wiring routed from the terminal 23 for appropriate electrical connection with the wiring layer 26. The rewiring layer 24 may include a metal such as Cu. In addition, in the rewiring layer 24 is formed a land that serves as a connection part with the contact via 25. This enables the contact via 25 to form electrical connection with the land of the rewiring layer 24 having a size relatively larger than that of the terminal 23, which is fine; thus, the contact via 25 can be formed more easily.

The bonding layer 21 fixes the second active component 22 by bonding the second active component 22 to the interlayer insulating film 34. Specifically, the bonding layer 21 may be an adhesive layer containing an ultraviolet curing resin or a thermosetting resin, and may be a die attach film, for example.

The contact via 25 is provided to penetrate the interlayer insulating film 35, and electrically connects the rewiring layer 24 to the wiring layer 26. The contact via 25 may include, for example, a metal such as Cu. The wiring layer 26 is provided in the interlayer insulating film 36. The wiring layer 26 may include, for example, a metal such as Cu. Note that the wiring layer 26 and the electrode pad 47 are electrically connected to each other by the contact via (not illustrated).

In the semiconductor device 1 according to the present embodiment, the second active component 22 with a smaller planar area is provided closer to the external connection terminal 48 than the first active component 12 is. Thus, in the semiconductor device 1, the connection via 17 that electrically connects the first active component 12 to the external connection terminal 48, and the second active component 22 can be provided in the projection region of the first active component 12 in the stacking direction. Consequently, according to the semiconductor device 1, a plurality of active components can be stacked with an efficient arrangement, which can further reduce the size and thickness of the semiconductor device 1.

1.2. Effect Provided by Semiconductor Device

Figure 2:
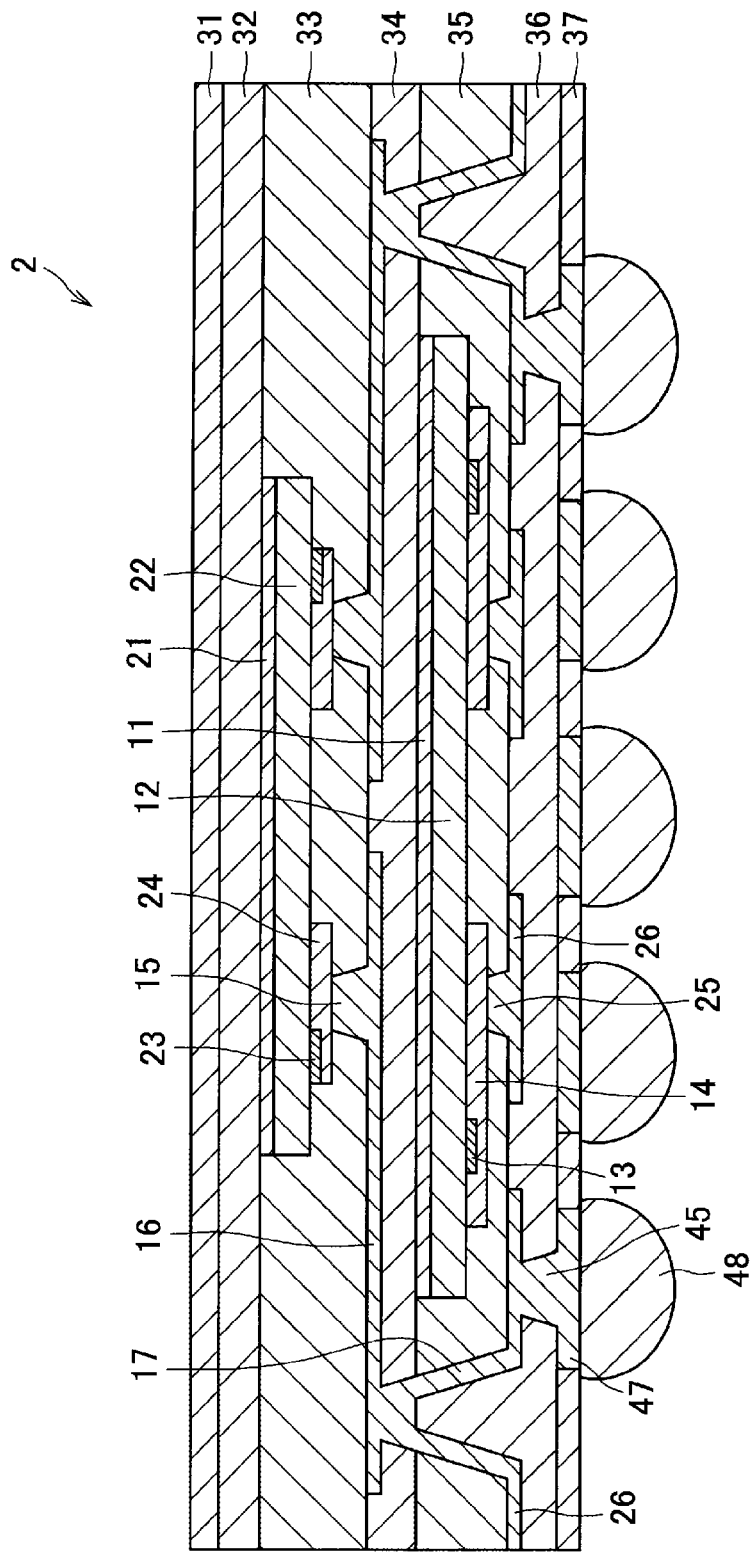
FIG. 2 is a cross-sectional diagram schematically illustrating a cross-sectional structure of a semiconductor device according to a comparative example.
Figure 3:
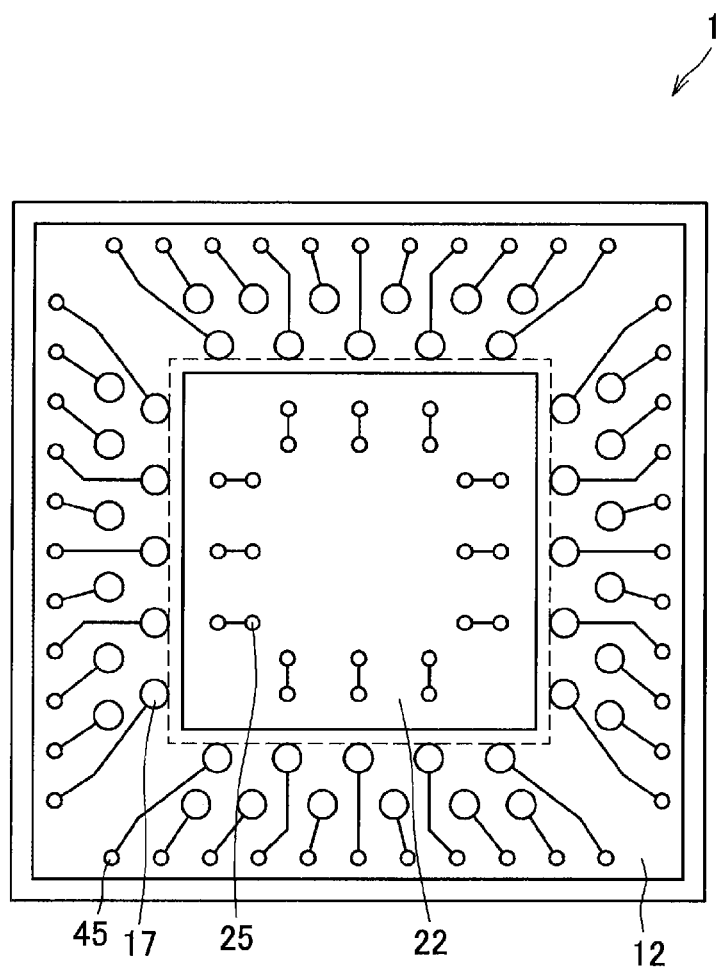
FIG. 3 is a top projection view of the semiconductor device according to the first embodiment of the present disclosure in planar view in a thickness direction.
Figure 4:
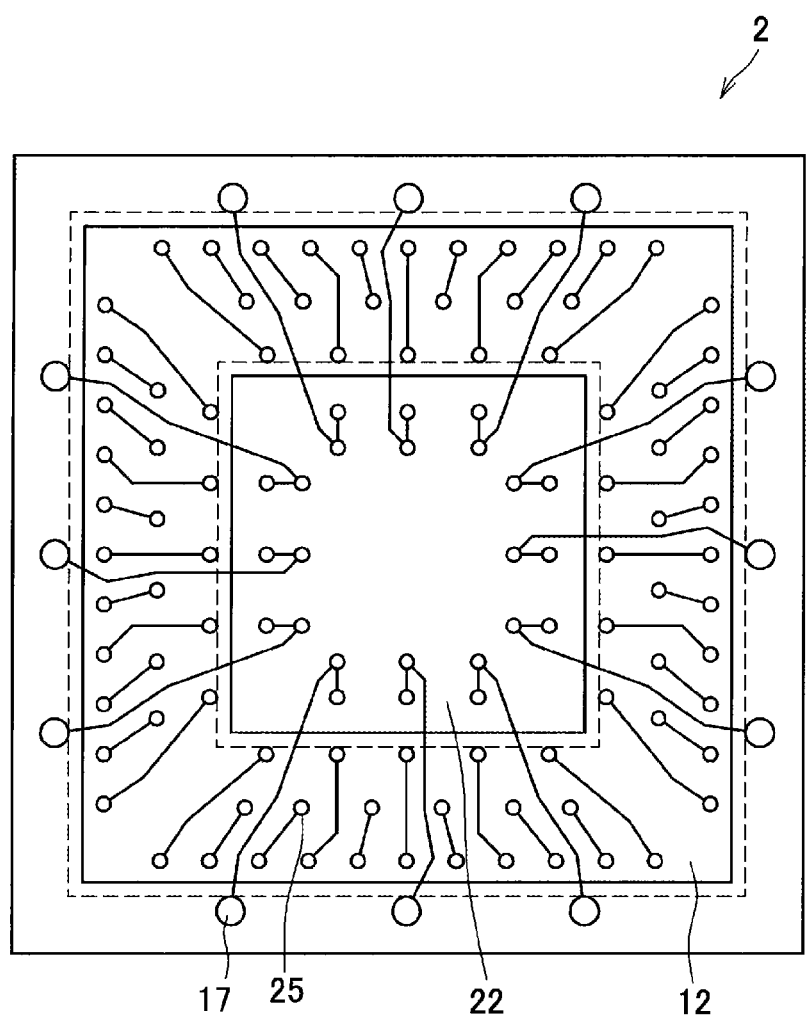
FIG. 4 is a top projection view of the semiconductor device according to the comparative example in planar view in the thickness direction.

Now, an effect of a reduction in size provided by the semiconductor device 1 according to the present embodiment will be verified with reference to FIGS. 2 to 4. FIG. 2 is a cross-sectional diagram schematically illustrating a cross-sectional structure of a semiconductor device according to a comparative example.

As illustrated in FIG. 2, in a semiconductor device 2 according to the comparative example, the positional relationship between the first active component 12 and the second active component 22 is inverted from that in the semiconductor device 1 according to the present embodiment. Specifically, in the semiconductor device 2 according to the comparative example, the first active component 12 is provided in the interlayer insulating film 35 on the one surface side where the external connection terminal 48 is provided, and the second active component 22 is provided in the interlayer insulating film 33 on the other surface side that is opposite to the one surface provided with the external connection terminal 48. That is, in the semiconductor device 2 according to the comparative example, the active component provided on the one surface side where the external connection terminal 48 is provided has a planar area larger than that of the active component provided on the other surface side that is opposite to the one surface provided with the external connection terminal 48.

In such a semiconductor device 2, the connection via 17 that electrically connects the second active component 22 to the external connection terminal 48 cannot be provided in the projection region of the first active component 12 in the stacking direction. Therefore, in the semiconductor device 2 according to the comparative example, the connection via 17 is provided to be isolated outside the first active component 12.

Here, the semiconductor device 1 according to the present embodiment and the semiconductor device 2 according to the comparative example were compared in size in planar view, with a size of the first active component 12 set to 4 mm square, the number of the terminals 13 set to 44, a size of the second active component 22 set to 2 mm square, and the number of the terminals 23 set to 12. Results of the comparison are illustrated in FIGS. 3 and 4. FIG. 3 is a top projection view of the semiconductor device 1 according to the present embodiment in planar view in the thickness direction, and FIG. 4 is a top projection view of the semiconductor device 2 according to the comparative example in planar view in the thickness direction.

As illustrated in FIG. 3, in the semiconductor device 1 according to the present embodiment, the connection via 17 is provided at a position 100 μm apart from a perimeter of the second active component 22. Therefore, the contact via 45 that is connected to the connection via 17 is provided inside a perimeter of the first active component 12. Consequently, the size of the semiconductor device 1 according to the present embodiment in planar view is 4.4 mm square additionally including a margin of 0.2 mm each from the perimeter of the first active component 12.

Meanwhile, as illustrated in FIG. 4, in the semiconductor device 2 according to the comparative example, the connection via 17 is provided at a position 100 μm apart from the perimeter of the first active component 12, avoiding the first active component 12. Therefore, the semiconductor device 2 according to the comparative example requires, as the size in planar view, a size additionally including a margin of 0.2 mm each from the connection via 17 provided at 100 μm from the perimeter of the first active component 12. Consequently, if a diameter of the connection via 17 is set to 200 μm, the size of the semiconductor device 2 according to the comparative example in planar view is 5.0 mm square.

The above verification results are collectively shown in Table 1 below.

TABLE 1

|  | First active component | | Second active component | | Semiconductor device |
| --- | --- | --- | --- | --- | --- |
|  | Size | Number of terminals | Size | Number of terminals | Size |
| Semiconductor device according to present embodiment | 4.0 mm square | 44 | 2.0 mm square | 12 | 4.4 mm square |
| Semiconductor device according to comparative example | 4.0 mm square | 44 | 2.0 mm square | 12 | 5.0 mm square |

As shown in Table 1, according to the semiconductor device 1 according to the present embodiment, the semiconductor device can be reduced in size in planar view, as compared with the semiconductor device 2 according to the comparative example in which the first active component 12 and the second active component 22 having the same sizes are used.

1.3. Advanced Examples

Figure 5A:
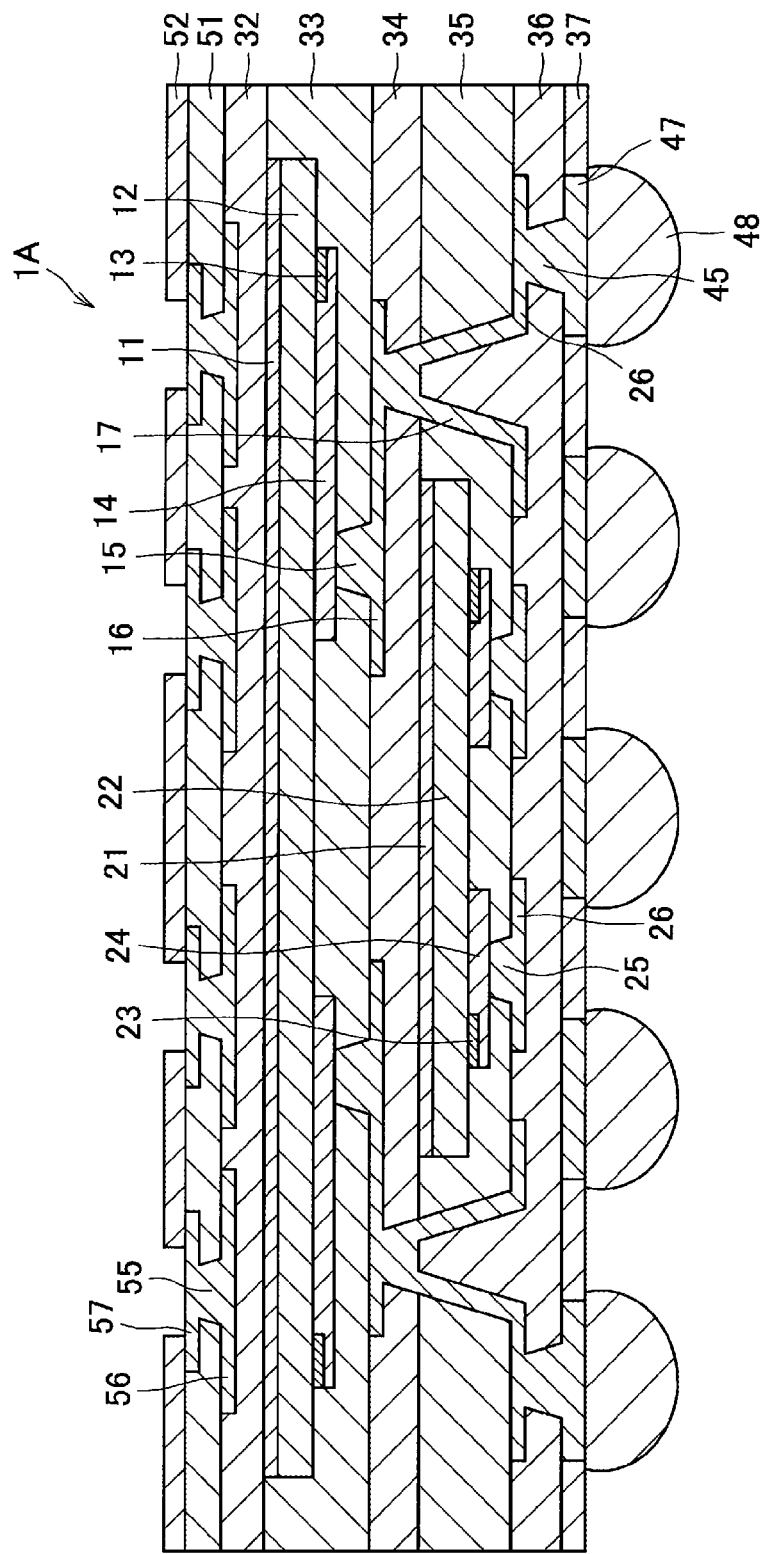
FIG. 5A is a cross-sectional diagram schematically illustrating a cross-sectional structure of a semiconductor device according to a first advanced example of the embodiment.
Figure 5B:
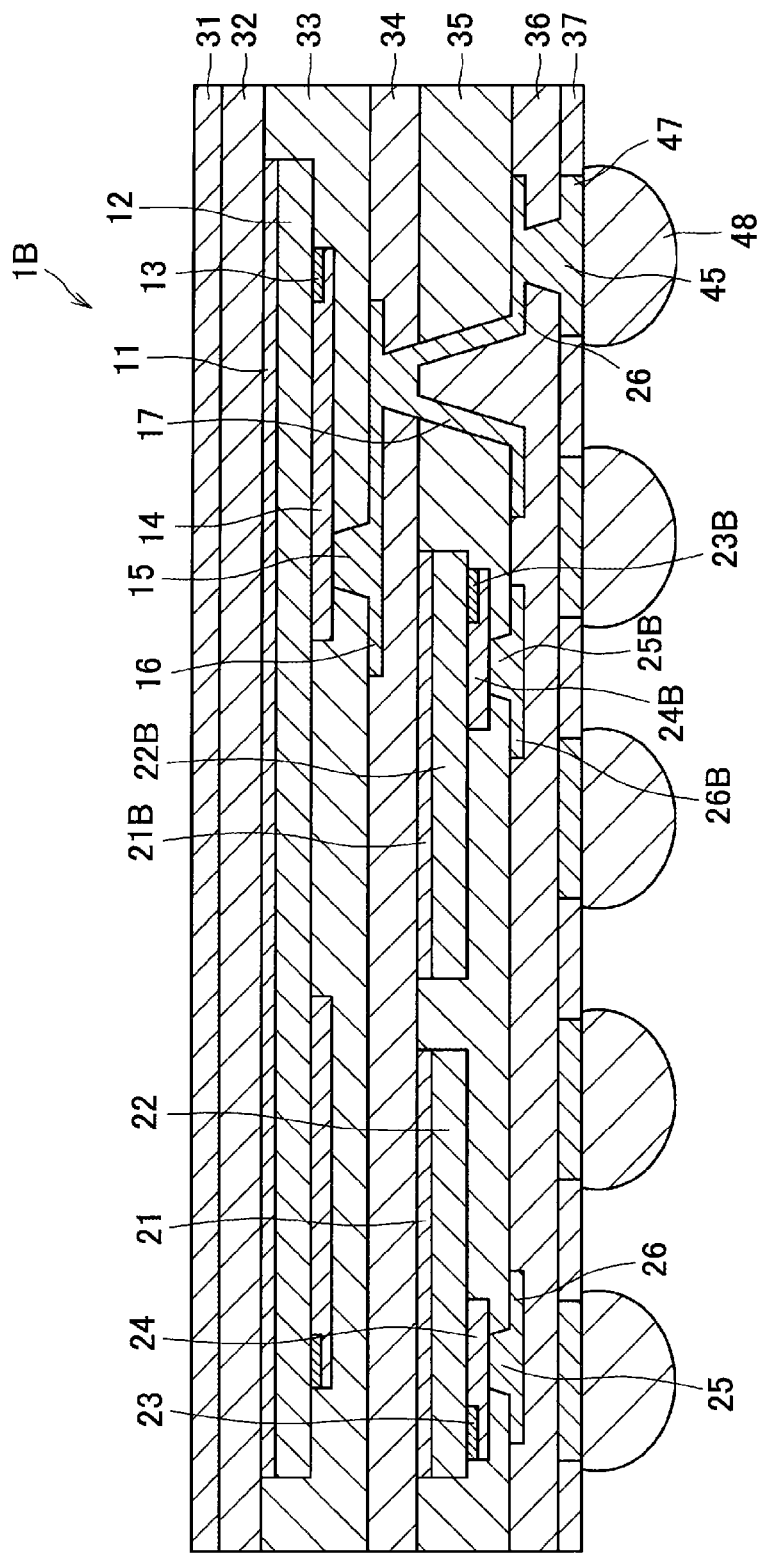
FIG. 5B is a cross-sectional diagram schematically illustrating a cross-sectional structure of a semiconductor device according to a second advanced example of the embodiment.

Next, advanced examples of the semiconductor device according to the present embodiment are described with reference to FIGS. 5A and 5B. FIG. 5A is a cross-sectional diagram schematically illustrating a cross-sectional structure of a semiconductor device according to a first advanced example. FIG. 5B is a cross-sectional diagram schematically illustrating a cross-sectional structure of a semiconductor device according to a second advanced example.

First Advanced Example

First, a semiconductor device 1A according to the first advanced example of the present embodiment is described with reference to FIG. 5A.

As illustrated in FIG. 5A, the semiconductor device 1A according to the first advanced example differs from the semiconductor device 1 illustrated in FIG. 1 in that a wiring layer 56, a contact via 55, a bump terminal 57, an interlayer insulating film 51, and a protective layer 52 are provided on the other surface side that is opposite to the one surface provided with the external connection terminal 48. That is, the semiconductor device 1A according to the first advanced example differs from the semiconductor device 1 illustrated in FIG. 1 in that the bump terminal 57 that performs input and output to/from an external electronic component or the like is provided on the other surface that is opposite to the one surface provided with the external connection terminal 48. Note that other configurations are substantially similar to those of the semiconductor device 1 illustrated in FIG. 1, and therefore are not described here.

Like the interlayer insulating films 32, 33, 34, 35, and 36, the interlayer insulating film 51 electrically insulates the wiring layer 56 and the contact via 55 embedded in the interlayer insulating films from each other. The interlayer insulating film 51 includes an organic resin with insulating properties. The interlayer insulating film 51 can be formed using, for example, an organic resin similar to that of the interlayer insulating films 32, 33, 34, 35, and 36.

The wiring layer 56 includes, for example, a metal such as Cu, and is provided in the interlayer insulating film 32. Note that the wiring layer 56 electrically connects the first active component 12, the wiring layer 16, or the like to the contact via 55 by a contact via (not illustrated). The contact via 55 is provided to penetrate the interlayer insulating film 51, and electrically connects the wiring layer 26 to the electrode pad 47. The contact via 55 may include, for example, a metal such as Cu.

The bump terminal 57 is provided in the interlayer insulating film 51, and electrically connects the contact via 55 to an external electronic component. The bump terminal 57 includes, for example, a metal such as Cu. In addition, on a surface of the bump terminal 57 may be formed a film of a metal such as nickel (Ni) and gold (Au). The bump terminal 57 may include a single layer, or may have a stacked structure of a plurality of layers.

The protective layer 52 is provided in a region other than a contact for electrical connection in the semiconductor device 1A in order to protect the semiconductor device 1A from external environment. Specifically, the protective layer 52 is provided on a surface of the semiconductor device 1A, being provided with an opening where the bump terminal 57 is exposed. The protective layer 52 may be, for example, a solder resist.

According to such a semiconductor device 1A according to the first advanced example, the bump terminal 57 provided on the surface of the semiconductor device 1A can form electrical connection with an external electronic component or the like. Consequently, the semiconductor device 1A according to the first advanced example can accept input/output from an external electronic component or the like also from the other surface side that is opposite to the one surface provided with the external connection terminal 48. Note that as will be described later in a second embodiment, an external electronic component that is electrically connected to the bump terminal 57 may be, for example, a type of sensor such as an image sensor, a passive component such as a resistor, a transformer, and a capacitor, micro electro mechanical systems (MEMS), and the like.

Second Advanced Example

Now, a semiconductor device 1B according to the second advanced example of the present embodiment will be described with reference to FIG. 5B.

As illustrated in FIG. 5B, the semiconductor device 1B according to the second advanced example differs from the semiconductor device 1 illustrated in FIG. 1 in that a third active component 22B is further built in.

Like the second active component 22, the third active component 22B is electrically connected to the external connection terminal 48 via a terminal 23B, a rewiring layer 24B, a contact via 25B, a wiring layer 26B, a contact via (not illustrated), and the electrode pad 47. In addition, the third active component 22B is bonded to the interlayer insulating film 34 by a bonding layer 21B, with its surface provided with a circuit or a terminal facing the surface side where the external connection terminal 48 is provided (downward in FIG. 5B).

Note that other configurations are substantially similar to those of the semiconductor device 1 illustrated in FIG. 1, and therefore are not described here. In addition, the terminal 23B is substantially similar to the terminal 23, the rewiring layer 24B is substantially similar to the rewiring layer 24, the contact via 25B is substantially similar to the contact via 25, and the wiring layer 26B is substantially similar to the wiring layer 26; therefore, they are not described here.

The third active component 22B is an active component built in the semiconductor device 1B, and is provided in the interlayer insulating film 35 on the surface side of the semiconductor device 1B where the external connection terminal 48 is provided. Like the second active component 22, the third active component 22B is a component that performs active operation such as amplification or rectification of supplied electric power, and specifically may be a processor such as an MPU, an integrated circuit element such as a PMIC and an authentication chip, a storage element such as a SDRAM and a flash memory, and the like.

Here, like the second active component 22, the third active component 22B is an active component whose planar area is smaller than that of the first active component 12, and is provided in the projection region of the first active component 12 in the stacking direction. This enables both the second active component 22 and the third active component 22B to be provided in the projection region of the first active component 12 in the stacking direction in the semiconductor device 1B. Therefore, according to the semiconductor device 1B, a large number of active components can be stacked inside with an efficient arrangement, which can further reduce the size and thickness of the semiconductor device 1B.

Note that although the third active component 22B is provided similarly in the interlayer insulating film 35 in which the second active component 22 is provided in FIG. 5B, the second advanced example is not limited to the above example. In the case where the semiconductor device is further multilayered, the third active component 22B may be provided closer to the surface provided with the external connection terminal 48 than the second active component 22 is. However, further multilayering of the semiconductor device increases production cost of the semiconductor device; hence, the third active component 22B is preferably provided in parallel with the second active component 22 in the interlayer insulating film 35 in which the second active component 22 is provided.

1.4. Method for Producing Semiconductor Device

Next, an example of a method for producing the semiconductor device according to the present embodiment is described with reference to FIGS. 6 to 29. Note that in the description of the production method, a direction in which the layers are stacked is expressed by "on".

Hereinafter, a method for producing the semiconductor device 1A according to the first advanced example of the present embodiment will be described. Methods for producing the semiconductor device 1 according to the present embodiment and the semiconductor device 1B according to the second advanced example can be understood easily according to the method for producing the semiconductor device 1A according to the first advanced example, and therefore are not described here.

First, a method for forming the rewiring layer 14 on the first active component 12 will be described with reference to FIGS. 6 to 11. FIGS. 6 to 11 are schematic cross-sectional diagrams for describing the steps for forming the rewiring layer 14 on the first active component 12.

Figure 6:
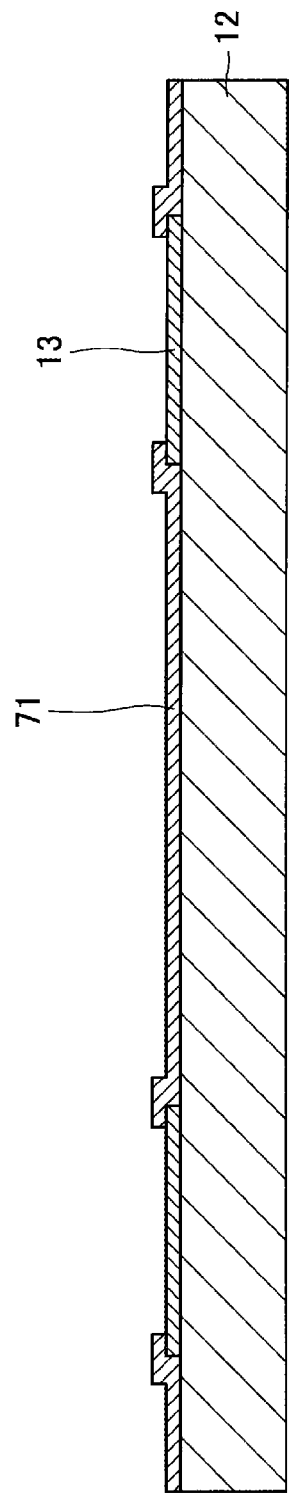
FIG. 6 is a schematic cross-sectional diagram for describing a step for forming a rewiring layer on a first active component.

First, as illustrated in FIG. 6, an inorganic insulating layer 71 including SiN or the like is formed, by chemical vapor deposion (CVD) or the like, on a surface of the first active component 12 on which the terminal 13 including Al is formed, and an opening is formed by lithography or the like.

Figure 7:
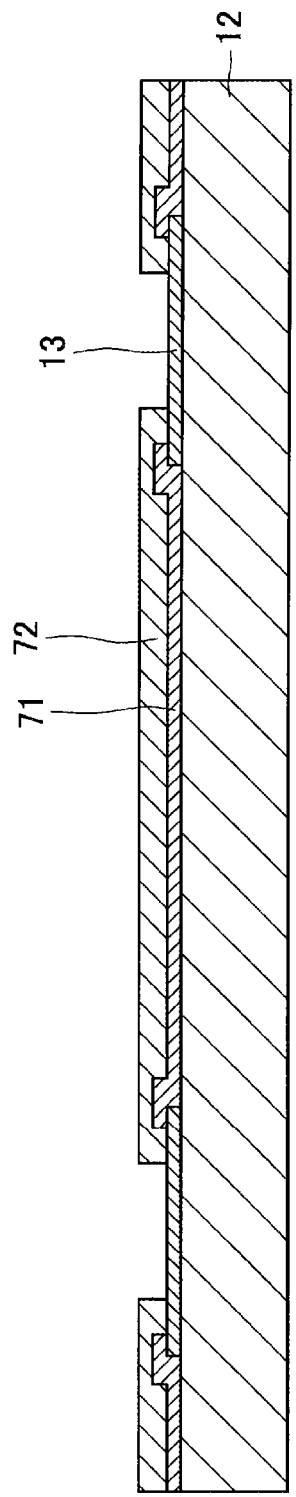
FIG. 7 is a schematic cross-sectional diagram for describing a step for forming a rewiring layer on a first active component.

Then, as illustrated in FIG. 7, an organic insulating layer 72 including polyimide or polybenzoxazole is formed on the inorganic insulating layer 71 and the terminal 13 by a spin coating method or the like, and an opening is formed to expose the terminal 13 by lithography or the like.

Figure 8:
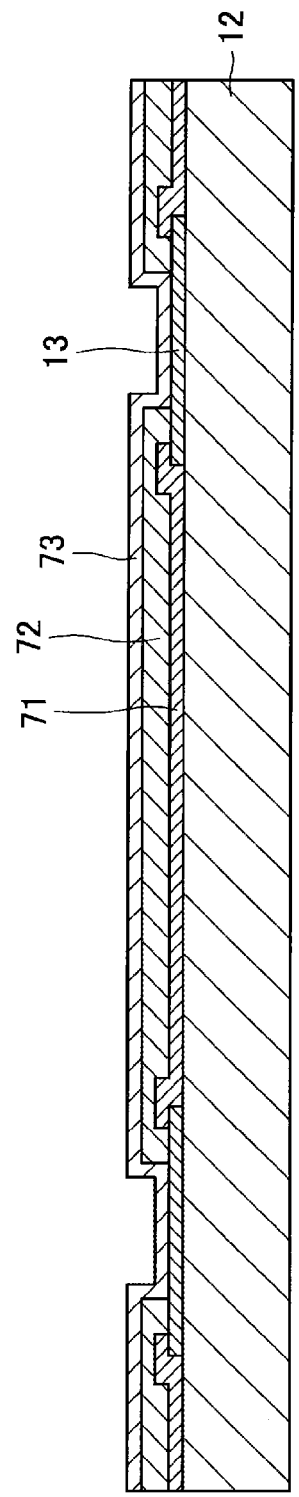
FIG. 8 is a schematic cross-sectional diagram for describing a step for forming a rewiring layer on a first active component.

Next, as illustrated in FIG. 8, a film of TiW of approximately 10 nm to 100 nm and a film of Cu of approximately 100 nm to 1000 nm are formed on the organic insulating layer 72 by a sputtering method to form a seed layer 73. Note that the seed layer 73 can also be formed using a high-melting metal, such as Cr, Ni, Ti, and Pt, in place of TiW, and can also be formed using an alloy of these high-melting metals, such as TiCu. In addition, the seed layer 73 can also be formed using a metal such as Ni, Ag, and Au in place of Cu, or an alloy of these.

Figure 9:
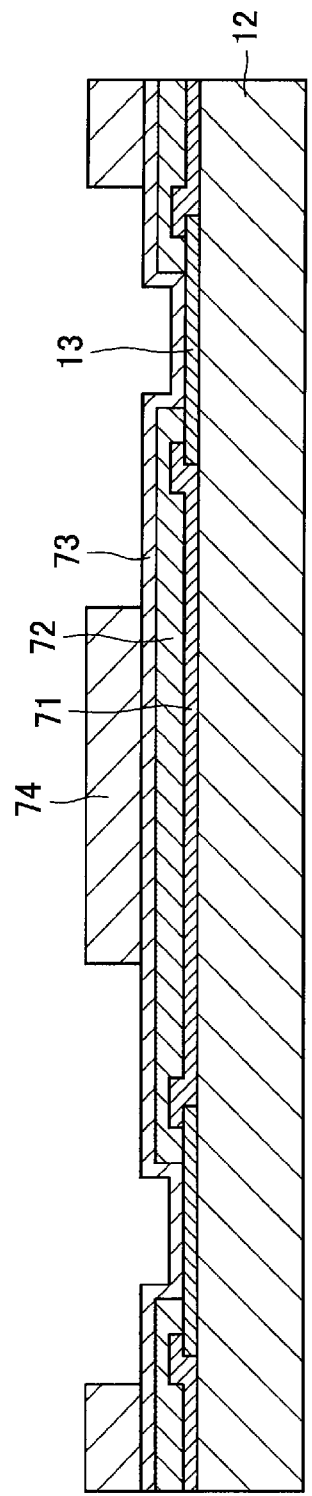
FIG. 9 is a schematic cross-sectional diagram for describing a step for forming a rewiring layer on a first active component.

After that, as illustrated in FIG. 9, a photoresist 74 is formed on the seed layer 73 by a spin coating method or the like, and the photoresist 74 in a region where the rewiring layer 14 is to be formed is removed by photolithography or the like. Note that such patterning of the resist is specifically performed through steps of surface cleaning, resist application, drying, exposure, and development.

Figure 10:
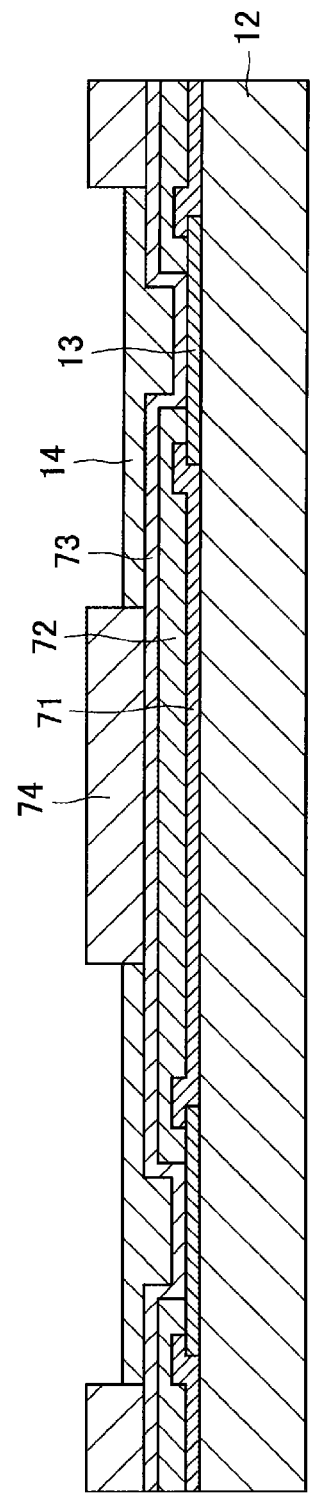
FIG. 10 is a schematic cross-sectional diagram for describing a step for forming a rewiring layer on a first active component.

Then, as illustrated in FIG. 10, the rewiring layer 14 is formed on the seed layer 73 by a copper electroplating method, a nickel electroplating method, or the like. In the rewiring layer 14, the land for contact via connection is preferably formed with a diameter of approximately 50 μm to 100 μm, and wiring is preferably formed with a thickness of approximately 3 μm to 10 μm and a minimum width of approximately 10 μm.

Figure 11:
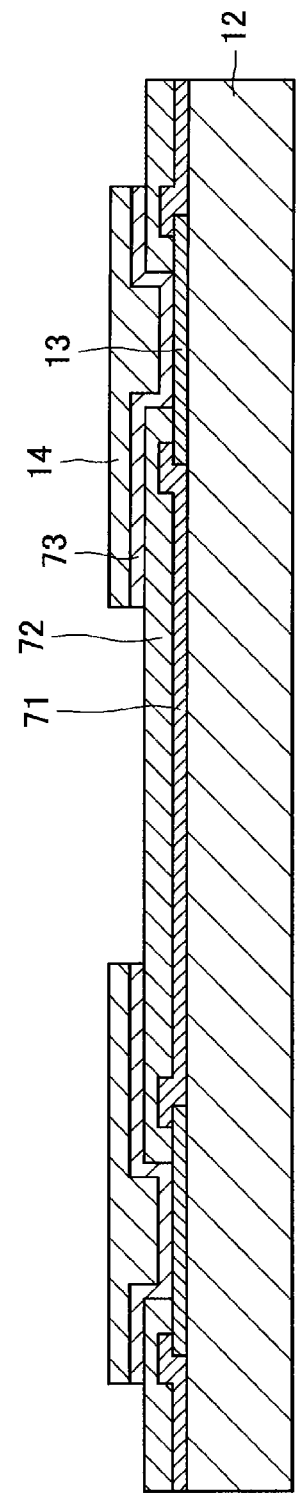
FIG. 11 is a schematic cross-sectional diagram for describing a step for forming a rewiring layer on a first active component.

Next, as illustrated in FIG. 11, the photoresist 74 is removed, the rewiring layer 14 is masked with a resist or the like, and then dry etching such as Ar ion milling is performed to remove the unnecessary seed layer 73 and electrically separate the rewiring layers 14 from each other. Note that the seed layer 73 can also be removed by wet etching using a solution such as aqua regia, cerium(IV) diammonium nitrate, or potassium hydroxide. However, wet etching has a possibility of causing side etching and a decrease in thickness in the rewiring layer 14; hence, with these in consideration, the seed layer 73 is preferably removed by dry etching.

Through the above steps, the rewiring layer 14 can be formed on the first active component 12. The rewiring layer 24 can be formed on the second active component 22 by similar steps.

Now, the method for producing the semiconductor device 1A according to the first advanced example will be described with reference to FIGS. 12 to 29. FIGS. 12 to 29 are schematic cross-sectional diagrams for describing the steps of the method for producing the semiconductor device 1A according to the first advanced example.

Figure 12:
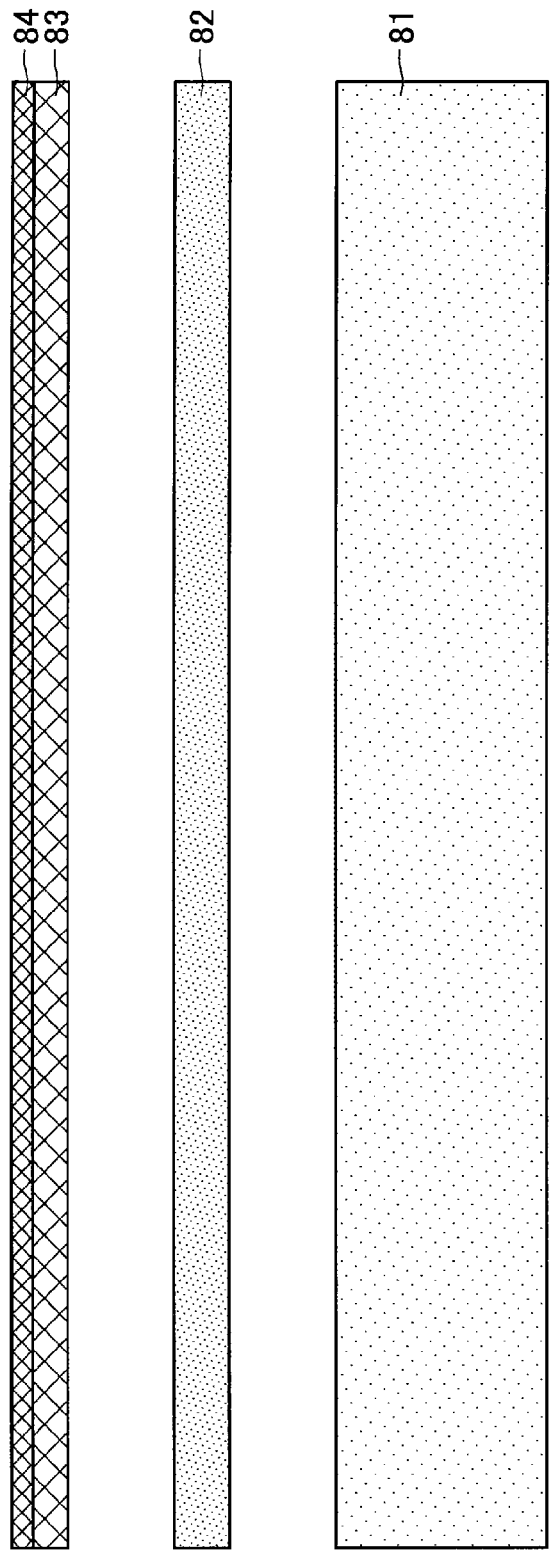
FIG. 12 is a schematic cross-sectional diagram for describing a step of a method for producing the semiconductor device according to the first advanced example.

First, as illustrated in FIG. 12, a support substrate 81, an adhesive resin layer 82, and a peelable copper foil including an ultrathin copper foil 84 and a carrier copper foil 83 are prepared.

Figure 13:
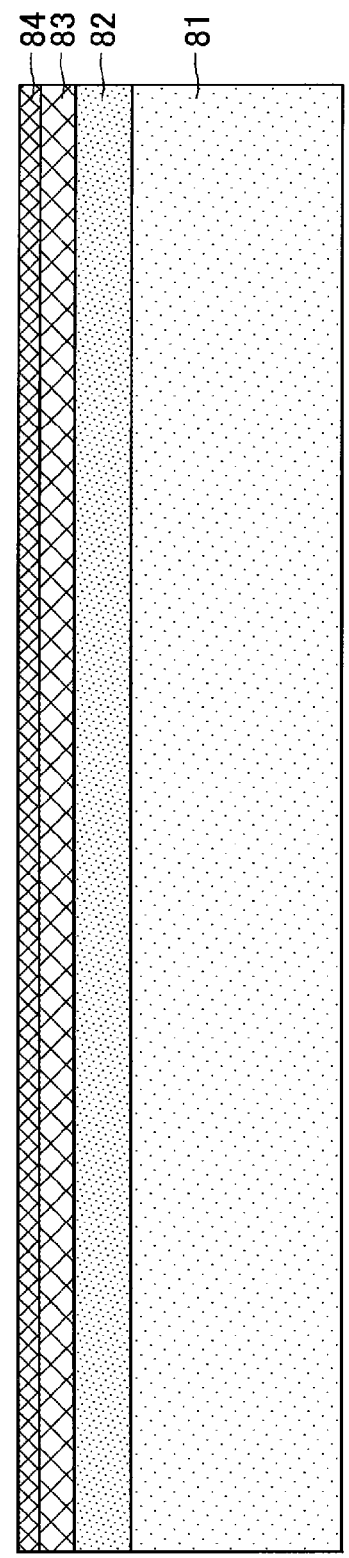
FIG. 13 is a schematic cross-sectional diagram for describing a step of a method for producing the semiconductor device according to the first advanced example.

Next, as illustrated in FIG. 13, the peelable copper foil including the ultrathin copper foil 84 and the carrier copper foil 83 is bonded to one surface of the support substrate 81 with the adhesive resin layer 82 therebetween by thermocompression bonding by roll lamination or laminating press.

Note that as the support substrate 81, any of various substrates including an inorganic material, a metal material, a resin material, or the like can be used. Specifically, a substrate including Si, glass, ceramics, copper, a copper alloy, aluminum, an aluminum alloy, stainless steel, a polyimide resin, an epoxy resin, or the like can be used as the support substrate 81.

In addition, the peelable copper foil is obtained by vacuum deposition of the carrier copper foil 83 with a thickness of 18 μm to 35 μm on the ultrathin copper foil 84 with a thickness of 2 μm to 5 μm. The peelable copper foil is formed in a manner that the ultrathin copper foil 84 and the carrier copper foil 83 can be peeled off from each other easily in a later step. Consequently, using the peelable copper foil enables the support substrate 81 to be peeled off easily from the semiconductor device 1A in a later step. As the peelable copper foil, for example, 3FD-P3/35 produced by Furukawa Circuit Foil Co., Ltd., MT-18S5DH produced by Mitsui Mining & Smelting Co., Ltd., or the like can be used.

As the adhesive resin layer 82, an epoxy resin, a polyimide resin, a PPE resin, a phenol resin, a PTFE resin, a silicon resin, a polybutadiene resin, a polyester resin, a melamine resin, a urea resin, a PPS resin, a PPO resin, and the like in which glass fiber is contained as a reinforcing material can be used. In addition, the adhesive resin layer 82 may contain nonwoven aramid fabric, aramid fiber, or polyester fiber as a reinforcing material.

Figure 15:
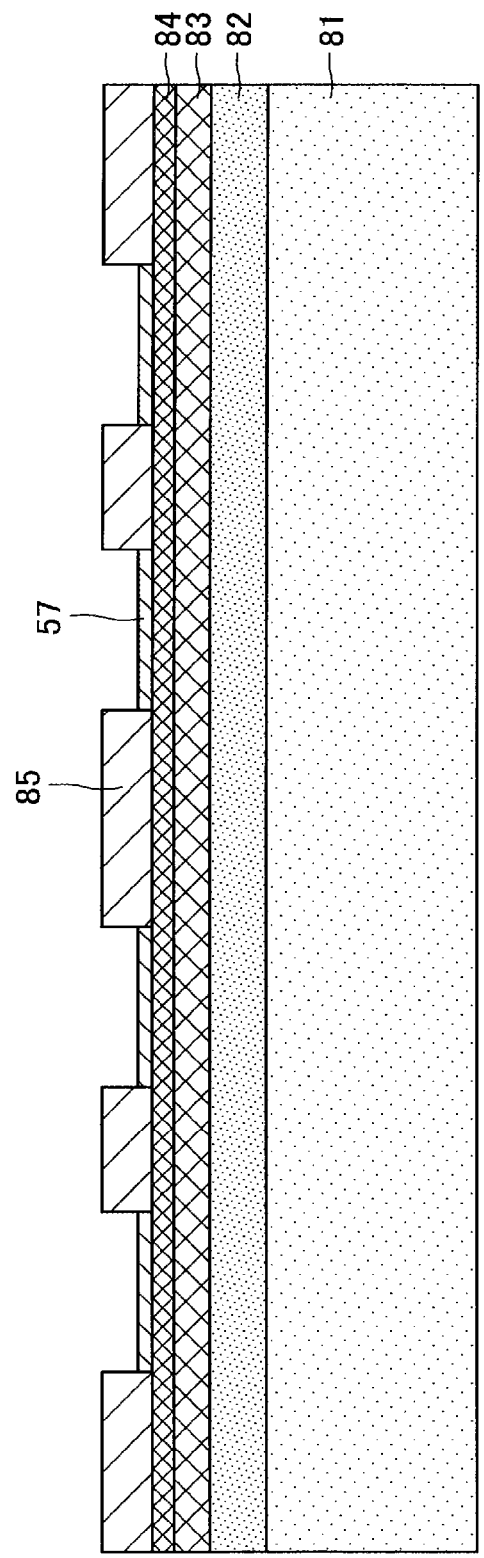
FIG. 15 is a schematic cross-sectional diagram for describing a step of a method for producing the semiconductor device according to the first advanced example.
Figure 117:
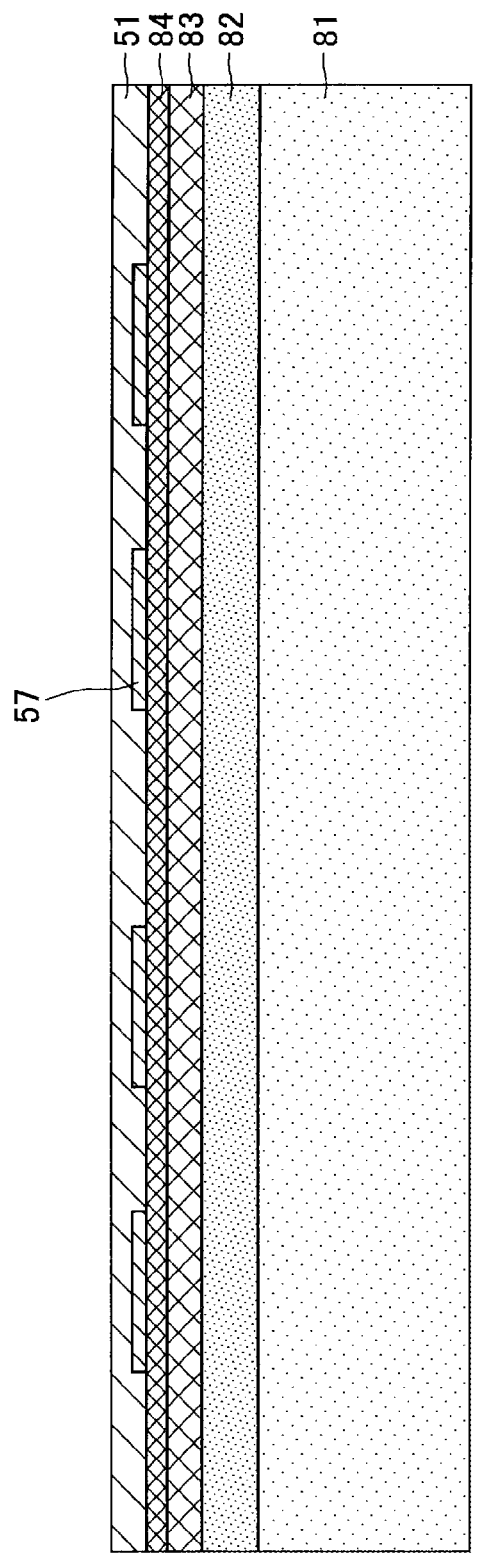

In addition, on the ultrathin copper foil 84, a plating undercoat with a thickness of 0.5 μm to 3 μm may be formed by an electroless copper plating method. The plating undercoat functions as a conductive layer for forming the bump terminal 57 by a copper electroplating method as illustrated in FIG. 15. However, the bump terminal 57 may be formed by bringing an electrode for copper electroplating in direct contact on the ultrathin copper foil 84, without forming a plating undercoat.

Figure 14:
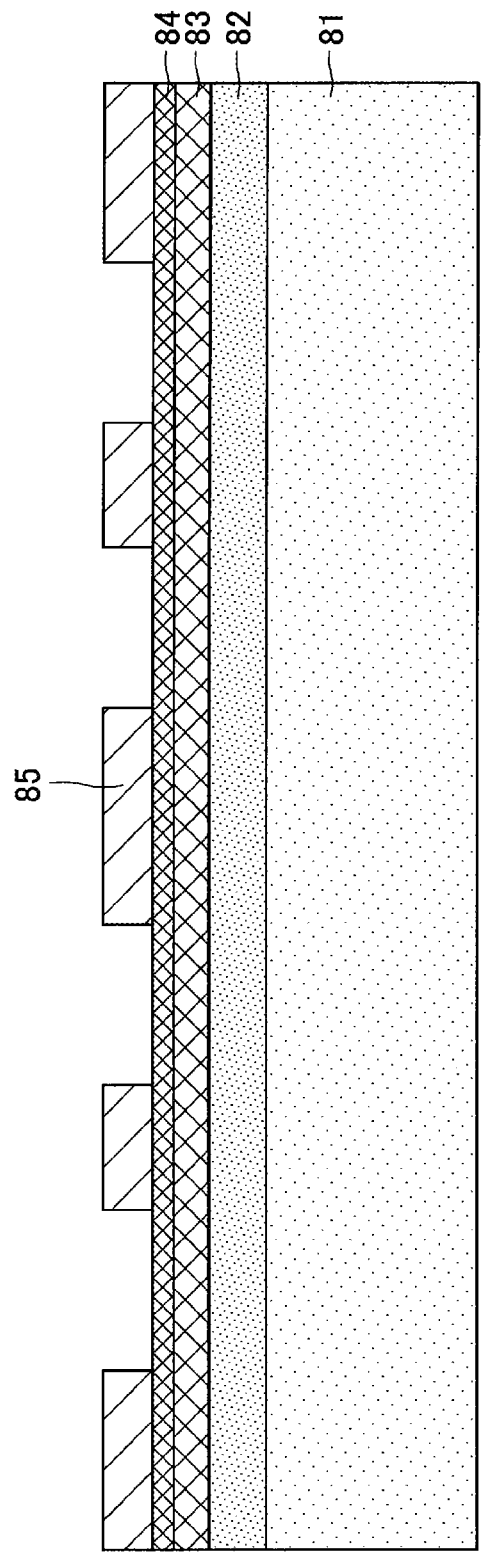
FIG. 14 is a schematic cross-sectional diagram for describing a step of a method for producing the semiconductor device according to the first advanced example.

Next, as illustrated in FIG. 14, a dry film plating resist is attached on the ultrathin copper foil 84 or the plating undercoat (not illustrated) by a roll lamination method or the like and subjected to patterning; thus, a resist layer 85 is formed. After that, as illustrated in FIG. 15, the bump terminal 57 with a thickness of approximately 15 μm is formed on the ultrathin copper foil 84 or the plating undercoat (not illustrated) by a copper electroplating method.

Then, as illustrated in FIG. 16, the resist layer 85 is peeled off, and then the exposed surface of the bump terminal 57 is subjected to roughening treatment as pretreatment for forming the interlayer insulating film 51. This can improve adhesiveness between the bump terminal 57 and the interlayer insulating film 51. Note that the roughening treatment can be performed by blackening treatment by oxidation-reduction, or soft etching treatment using a sulfuric peroxide mixture (i.e., a mixture of hydrogen peroxide water and sulfuric acid).

Next, as illustrated in FIG. 17, the interlayer insulating film 51 is bonded onto the bump terminal 57 by thermocompression bonding by roll lamination, laminating press, or the like. Specifically, in the case of using an epoxy resin as the interlayer insulating film 51, the epoxy resin with a thickness of 45 μm may be crimped by roll lamination. In addition, in the case of using a glass epoxy resin as the interlayer insulating film 51, thermocompression bonding may be performed by performing laminating press after overlapping a copper foil with any thickness.

Figure 18:
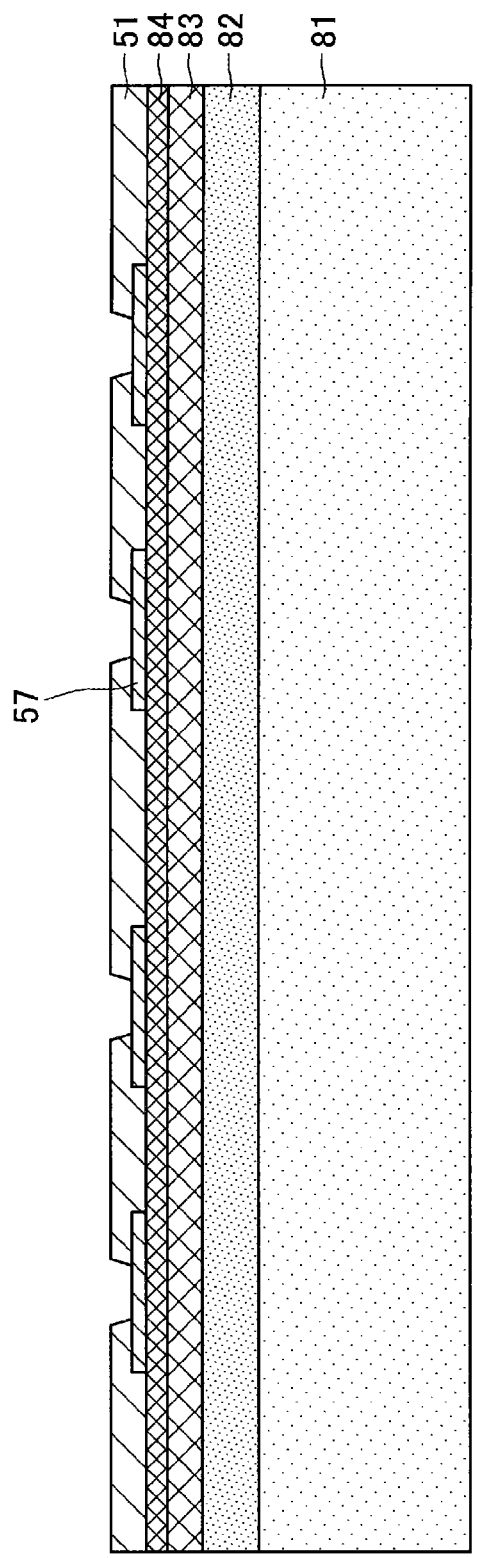
FIG. 18 is a schematic cross-sectional diagram for describing a step of a method for producing the semiconductor device according to the first advanced example.

Then, as illustrated in FIG. 18, a via hole for forming the contact via 55 is formed in the interlayer insulating film 51 by a laser method or a photoetching method. Specifically, in the case where the interlayer insulating film 51 is a thermosetting resin, the via hole can be formed by the laser method.

As a laser used for the laser method, an ultraviolet laser such as a harmonic YAG laser and an excimer laser, and an infrared laser such as a $CO_2$ laser can be used.

However, in the case where the via hole is formed by the laser method, a residue of the interlayer insulating film 51 may remain at the bottom of the via hole. In such a case, desmear treatment is preferably performed to decompose and remove a residual resin of the interlayer insulating film 51. Note that the desmear treatment is treatment of swelling a resin by a strong base and then decomposing and removing the resin by using an oxidizer such as chromic acid or a permanganic acid aqueous solution. In addition, the residue of the interlayer insulating film 51 may be removed by plasma treatment or sandblast treatment using an abrasive, in place of the desmear treatment.

Meanwhile, in the case where the interlayer insulating film 51 is a photosensitive resin, the via hole can be formed by the photoetching method. Specifically, in the photoetching method, a region other than a region where the via hole is to be formed is masked, and then the photosensitive resin is exposed to ultraviolet light or the like, and the photosensitive resin is removed by development; thus, the via hole can be formed.

All the contact vias and the connection vias provided in the semiconductor device 1A have a relatively small diameter, hence, via holes of these vias are preferably formed by the laser method or the photoetching method, which takes short treatment time. Note that machining using a drill or the like is not preferable because it makes the diameter of the via hole larger, which is unsuitable for a reduction in size of the semiconductor device 1A, and makes treatment time longer.

Then, a surface of the bump terminal 57 is subjected to roughening treatment, and then electroless copper plating is performed on a wall surface of the via hole and a surface of the interlayer insulating film 51 to form a plating undercoat. After that, as in the formation of the bump terminal 57 described using FIGS. 14 to 16, a dry film plating resist is attached on the interlayer insulating film 51 by a roll lamination method or the like and subjected to patterning; thus, a resist layer having an opening in a region where the contact via 55 and the wiring layer 56 are to be formed is formed. Furthermore, the contact via 55 and the wiring layer 56 with a thickness of 15 μm are formed in the opening of the resist layer by a copper electroplating method.

Figure 19:
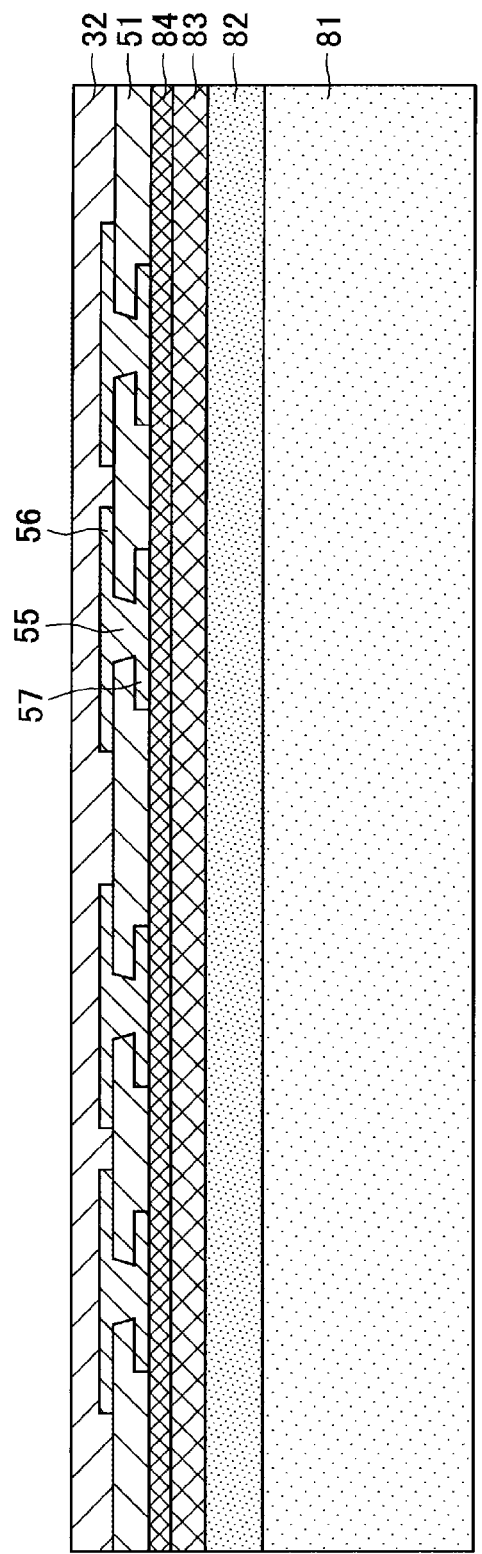
FIG. 19 is a schematic cross-sectional diagram for describing a step of a method for producing the semiconductor device according to the first advanced example.

Next, the resist layer is peeled off, and then the plating undercoat on the interlayer insulating film 51 is removed by flash etching or the like using a sulfuric peroxide mixture or the like; thus, the contact via 55 and the wiring layer 56 are formed. Furthermore, roughening treatment is performed, and then the interlayer insulating film 32 is bonded onto the wiring layer 56 by thermocompression bonding by roll lamination, laminating press, or the like; thus, a structure illustrated in FIG. 19 is formed.

Figure 20:
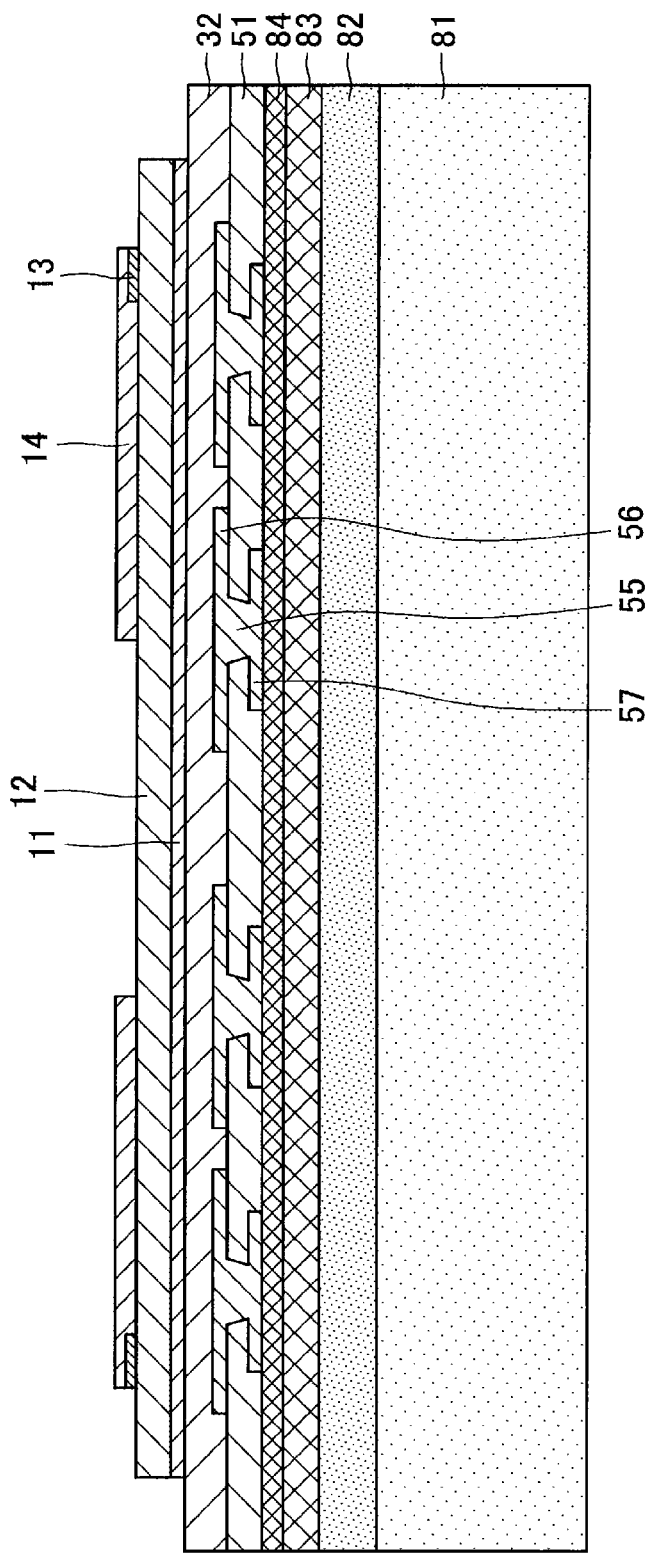
FIG. 20 is a schematic cross-sectional diagram for describing a step of a method for producing the semiconductor device according to the first advanced example.

Then, as illustrated in FIG. 20, the first active component 12 is mounted on the interlayer insulating film 32, with its surface on which a semiconductor element or the like is formed facing upward (i.e., in a face-up state). Note that for the mounting of the first active component 12, a die attach film can be used, for example, as the bonding layer 11. In addition, the first active component 12 may be thinned to a thickness of approximately 30 μm to 50 μm in order to reduce the thickness of the semiconductor device 1A.

Figure 21:
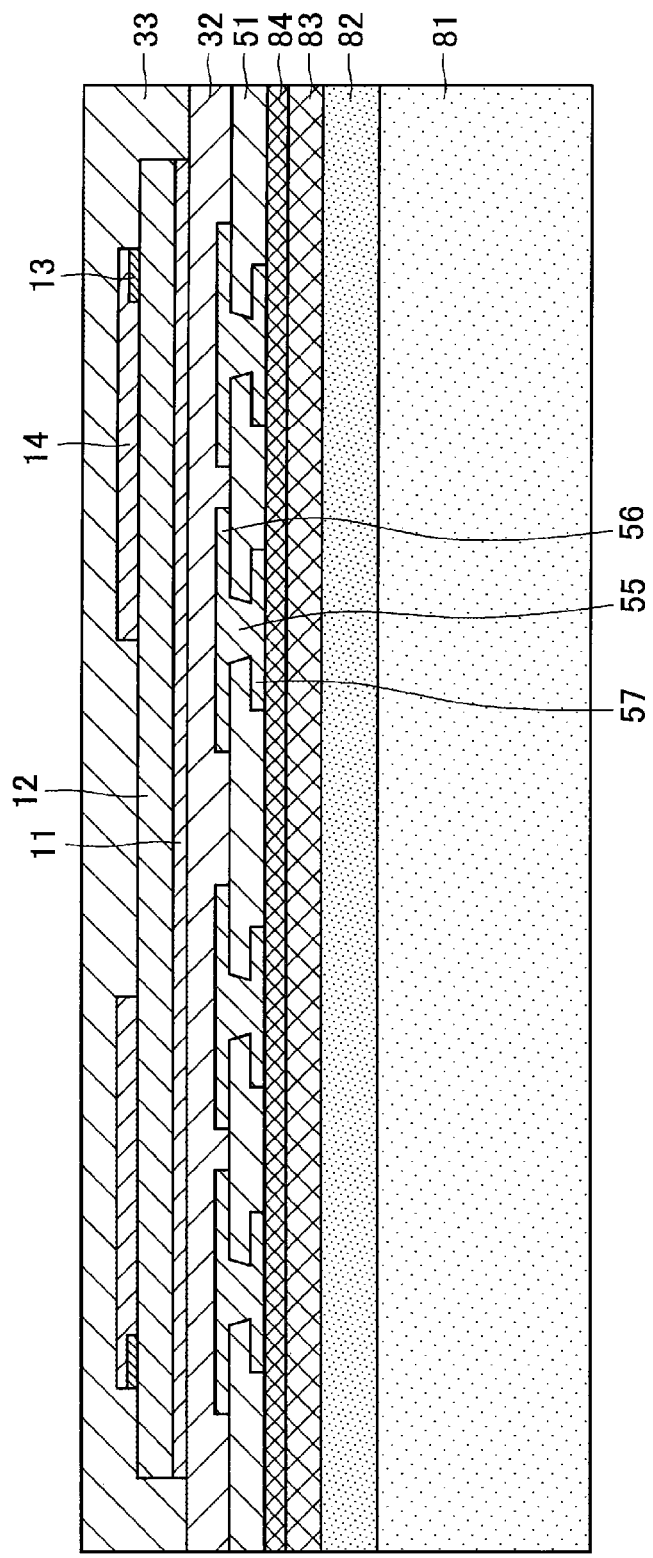
FIG. 21 is a schematic cross-sectional diagram for describing a step of a method for producing the semiconductor device according to the first advanced example.
Figure 22:
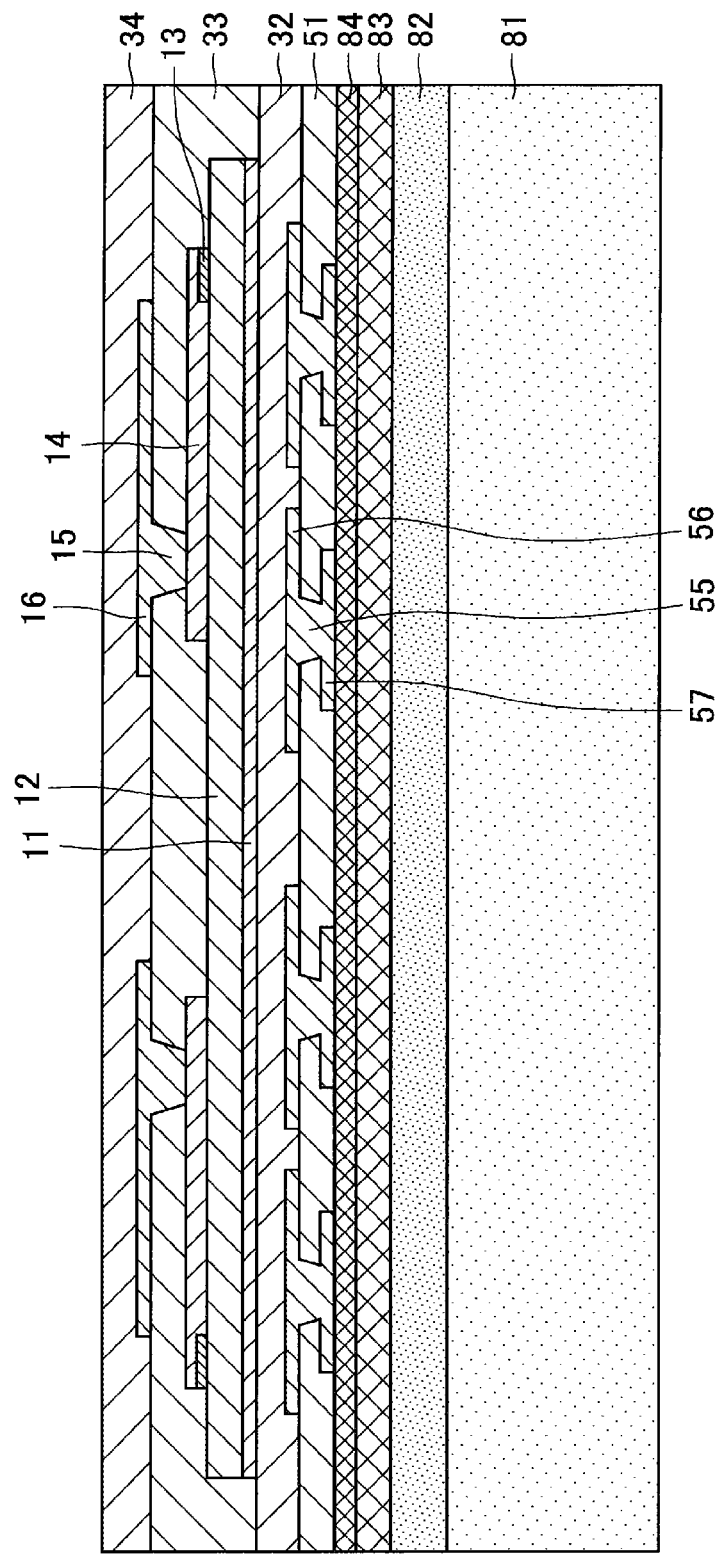
FIG. 22 is a schematic cross-sectional diagram for describing a step of a method for producing the semiconductor device according to the first advanced example.

Next, as illustrated in FIG. 21, the interlayer insulating film 33 is bonded onto the first active component 12 by thermocompression bonding by roll lamination, laminating press, or the like. Then, as in the steps described using FIGS. 18 and 19, via hole formation, desmear treatment, roughening treatment, electroless copper plating, and copper electroplating are performed; thus, the contact via 15 and the wiring layer 16 that are electrically connected to the rewiring layer 14 of the first active component 12 are formed, and the interlayer insulating film 34 is formed on the wiring layer 16, as illustrated in FIG. 22.

Figure 23:
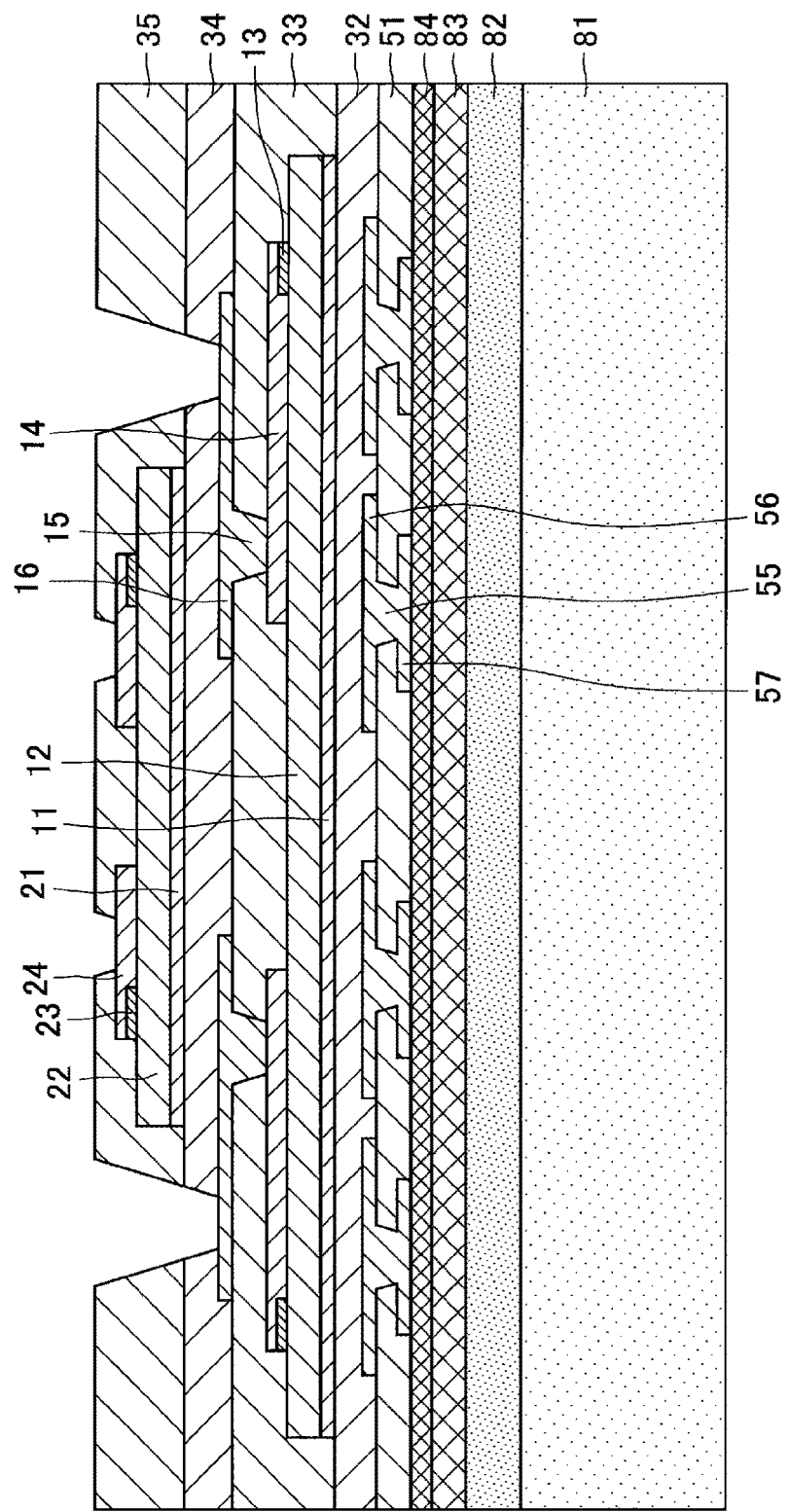
FIG. 23 is a schematic cross-sectional diagram for describing a step of a method for producing the semiconductor device according to the first advanced example.

Then, the second active component 22 is mounted on the interlayer insulating film 34 by a step similar to the step described using FIG. 20, and the interlayer insulating film 35 is formed by a step similar to the step described using FIG. 21. After that, as in the step described using FIG. 18, via hole formation, desmear treatment, and roughening treatment are performed; thus, openings are formed in part of the interlayer insulating films 35 and 34, and a via hole of the connection via 17 and a via hole of the contact via 25 are formed as illustrated in FIG. 23. The via hole of the connection via 17 is preferably provided approximately 100 μm apart from the second active component 22 in order to ensure insulating properties.

Note that the connection via 17 and the contact via 25 differ in depth of formation, and therefore also differ in diameter of the formed via. In addition, in the wiring layer 16 or the rewiring layer 24 that is connected to the connection via 17 or the contact via 25 is formed a connection part (a so-called land) corresponding to a diameter of the via that is connected. Table 2 below shows examples of the size of each via and the size of the corresponding connection part.

TABLE 2

|  |  | Contact via | Connection via |
| --- | --- | --- | --- |
| Via | Diameter | 20 μm to 30 μm | 80 μm to 150 μm |
|  | Depth | 20 μm to 30 μm | 80 μm to 150 μm |
| Connection part (land) | Diameter | 60 μm to 80 μm | 150 μm to 200 μm |

Figure 24:
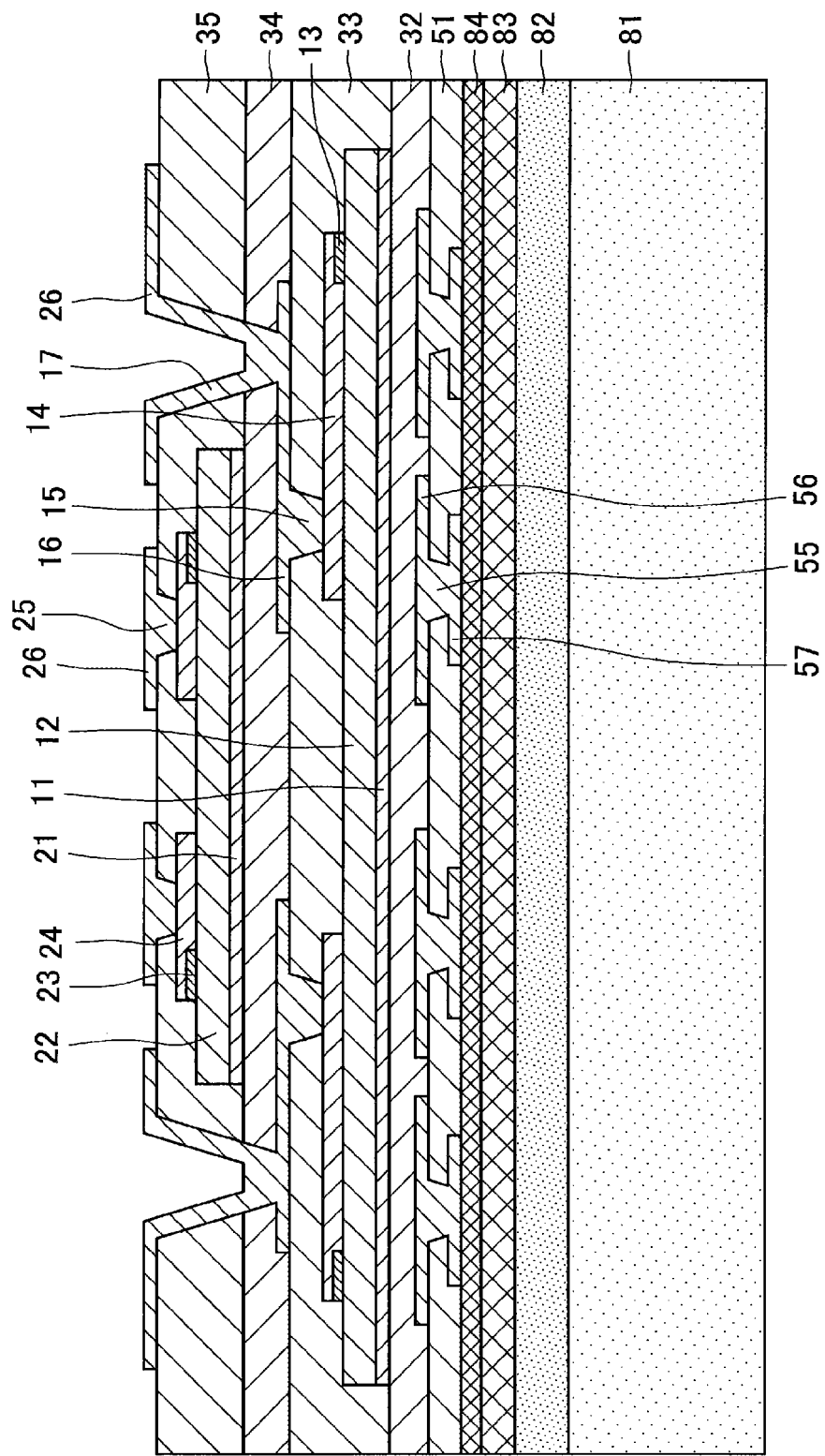
FIG. 24 is a schematic cross-sectional diagram for describing a step of a method for producing the semiconductor device according to the first advanced example.

Next, electroless copper plating and copper electroplating are performed by steps similar to the steps described using FIGS. 14 to 16; thus, the contact via 25, the connection via 17, and the wiring layer 26 are formed as illustrated in FIG. 24. Note that the contact via 25 has a small depth and therefore serves as a filled via whose interior is filled with copper plating, whereas the connection via 17 has a large depth and therefore serves as a conformal via whose interior is not filled with copper plating.

Figure 25:
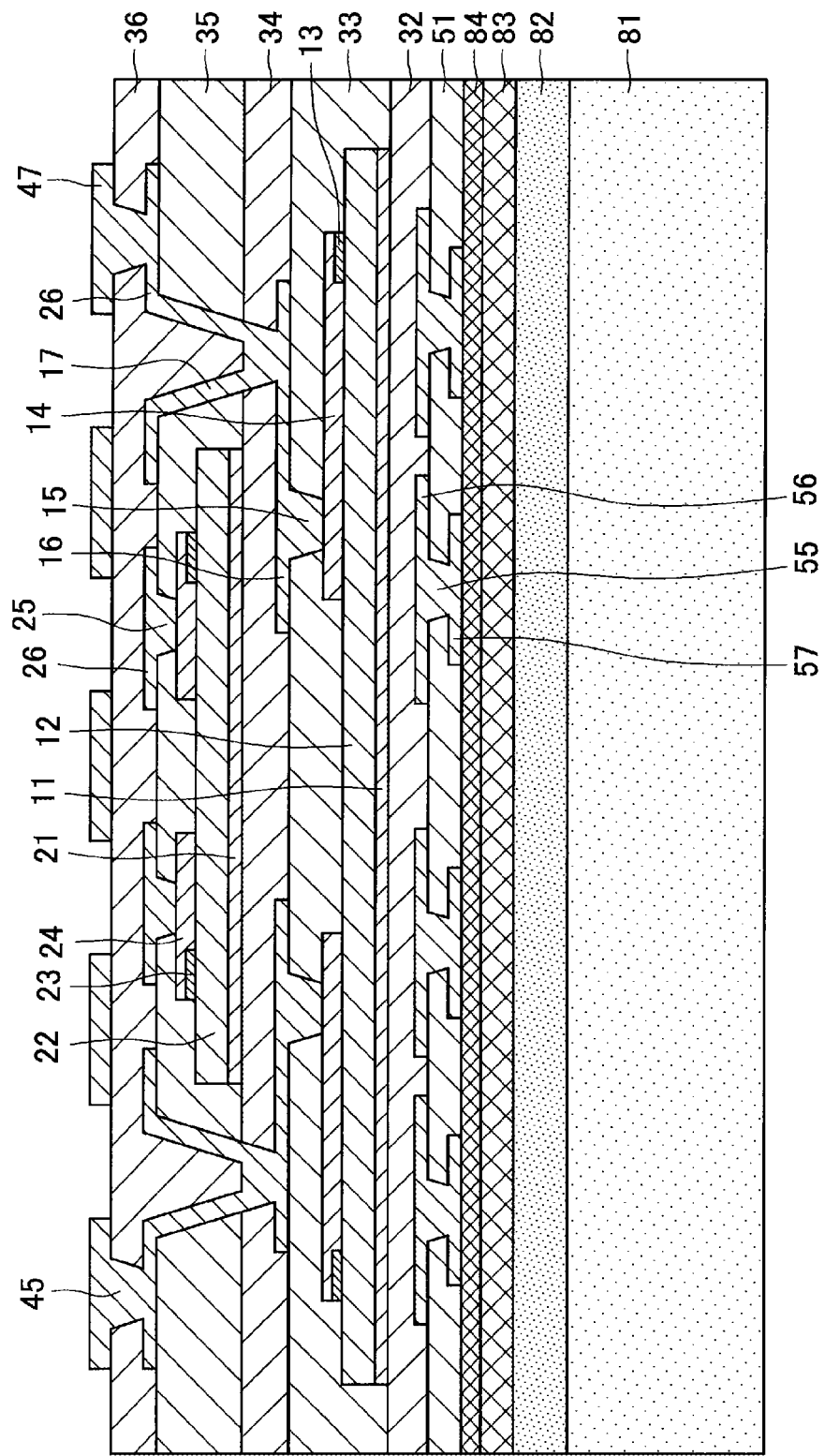
FIG. 25 is a schematic cross-sectional diagram for describing a step of a method for producing the semiconductor device according to the first advanced example.

Then, the interlayer insulating film 36 is bonded onto the wiring layer 26 by thermocompression bonding by roll lamination, laminating press, or the like. Thus, the interior of the via hole in which the connection via 17 is formed is filled with the interlayer insulating film 36. Then, as in the steps described using FIGS. 18 and 19, via hole formation, desmear treatment, roughening treatment, electroless copper plating, and copper electroplating are performed; thus, the contact via 45 and the electrode pad 47 that are electrically connected to the wiring layer 26 are formed, as illustrated in FIG. 25.

Figure 26:
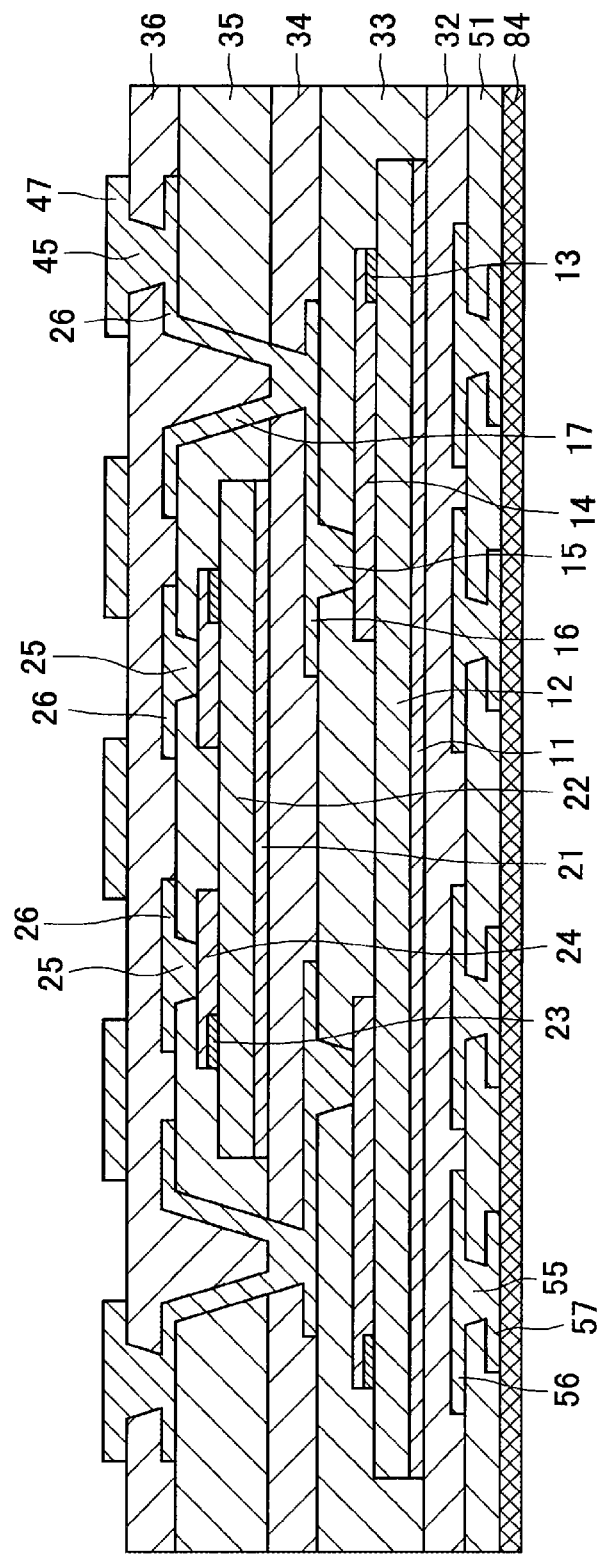
FIG. 26 is a schematic cross-sectional diagram for describing a step of a method for producing the semiconductor device according to the first advanced example.
Figure 27:
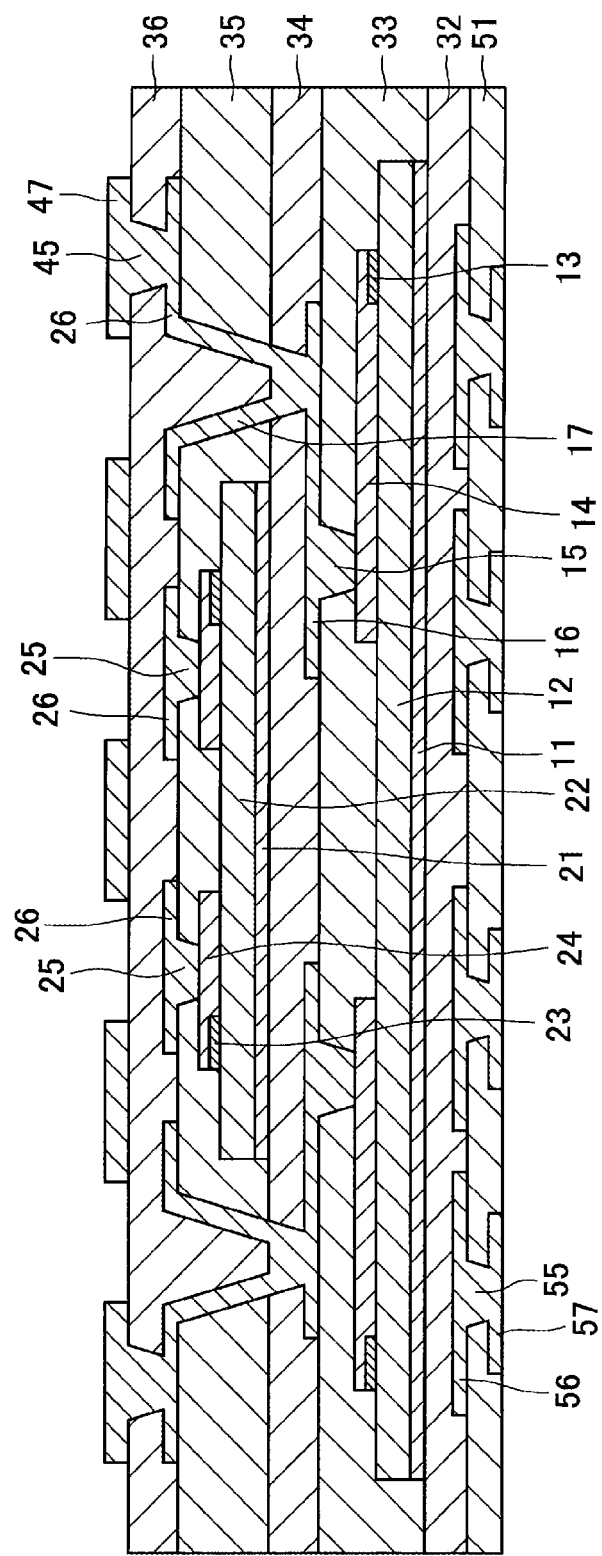
FIG. 27 is a schematic cross-sectional diagram for describing a step of a method for producing the semiconductor device according to the first advanced example.

After that, as illustrated in FIG. 26, the carrier copper foil 83 is peeled off from the ultrathin copper foil 84 of the peelable copper foil, together with the support substrate 81. Then, as illustrated in FIG. 27, the ultrathin copper foil 84 is removed by soft etching treatment using a sulfuric peroxide mixture; thus, the semiconductor device in which the electrode pad 47 and the bump terminal 57 are exposed on the surfaces can be obtained.

Figure 28:
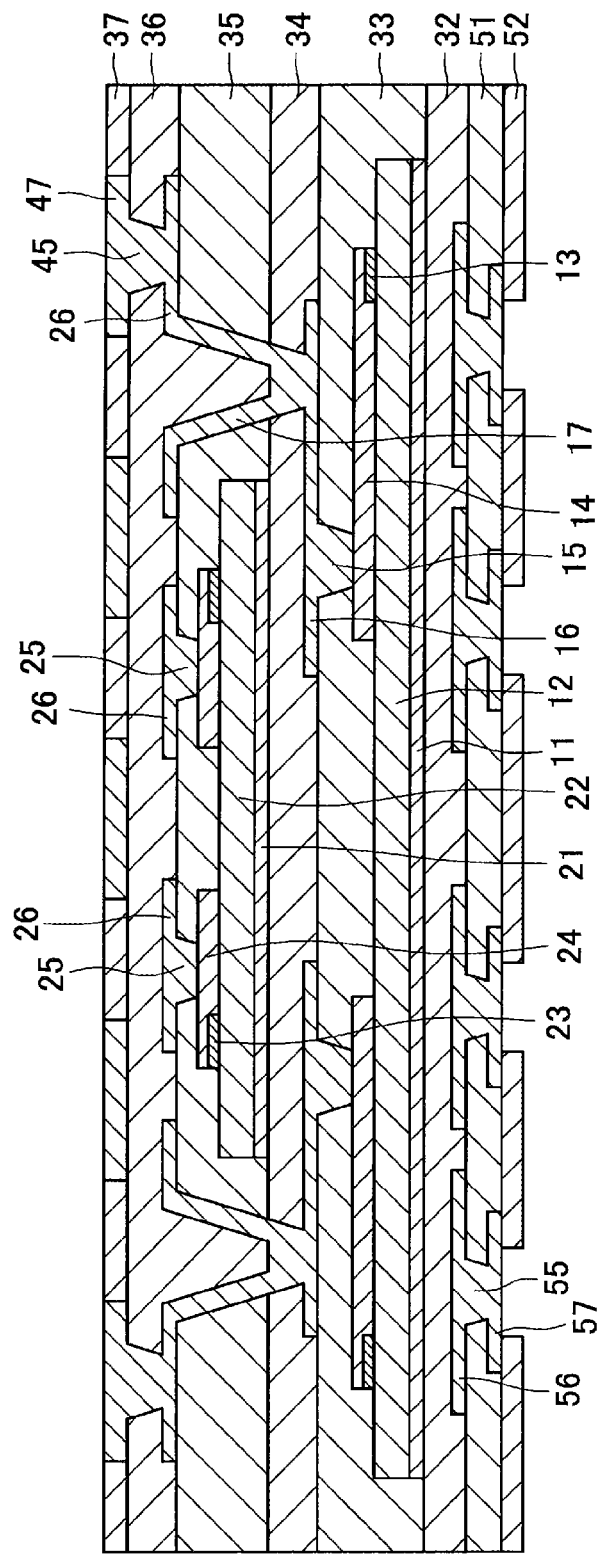
FIG. 28 is a schematic cross-sectional diagram for describing a step of a method for producing the semiconductor device according to the first advanced example.

Then, as illustrated in FIG. 28, the protective layers 31 and 37 including a solder resist are formed, with patterning performed to open contact portions of the electrode pad 47 and the bump terminal 57. In addition, the protective layers 31 and 37 may be formed using a film-type solder resist by using a roll coater.

Figure 29:
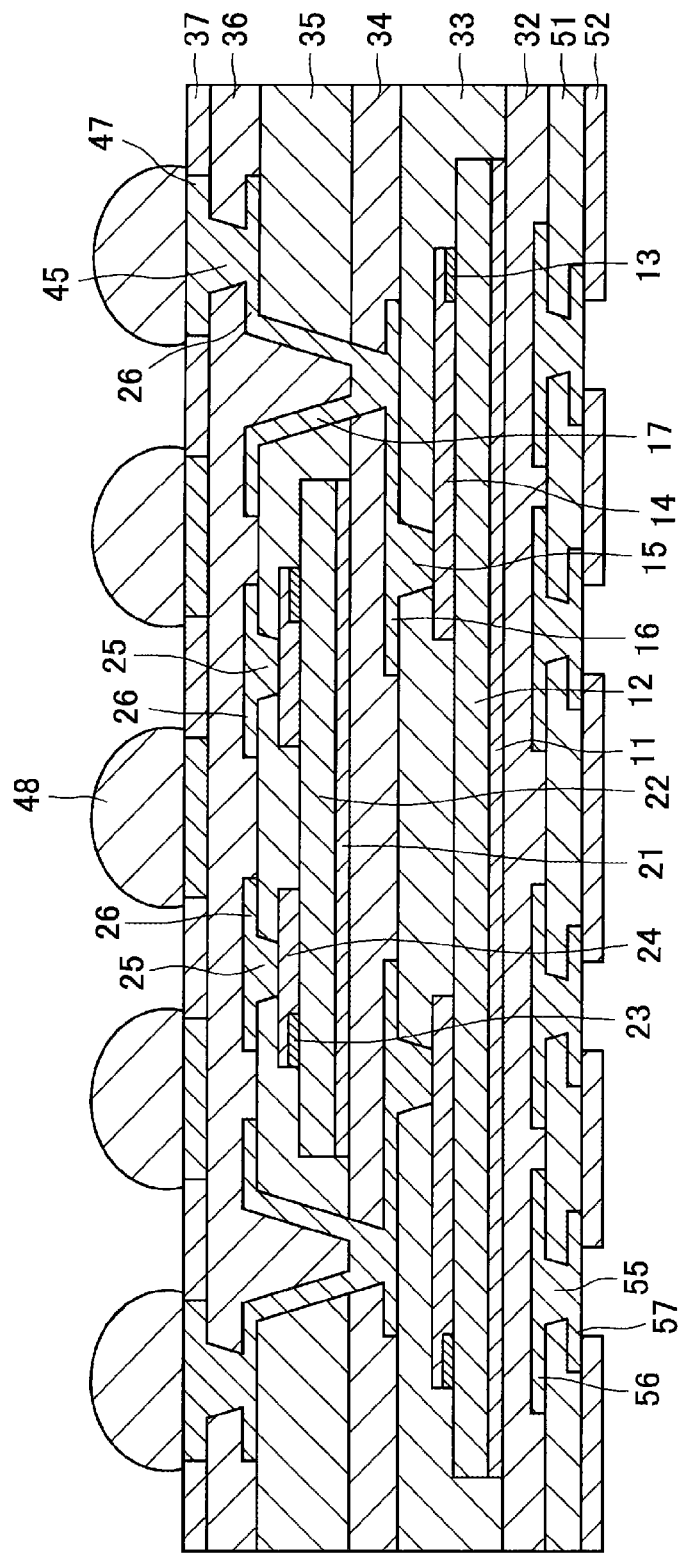
FIG. 29 is a schematic cross-sectional diagram for describing a step of a method for producing the semiconductor device according to the first advanced example.

Next, as illustrated in FIG. 29, a solder ball is installed as the external connection terminal 48 on the electrode pad 47. Note that the electrode pad 47 and the bump terminal 57 provided in the openings of the protective layers 31 and 37 may be provided with electroless nickel plating of 3 µm or more and electroless gold plating of 0.03 µm or more. In addition, a thickness of the electroless gold plating may be 0.5 µm or more, or may be 1.0 µm or more. In addition, on the electrode pad 47 and the bump terminal 57 provided in the openings of the protective layers 31 and 37 may be formed an organic antirust coating besides metal plating.

Furthermore, after the formation of the external connection terminal 48, cutting is performed along an outer shape of the semiconductor device 1A, with a dicing machine or the like, for separation into pieces; thus, the semiconductor device 1A can be produced.

The semiconductor device according to the first embodiment of the present disclosure has been described in detail.

2. Second Embodiment

Next, an electronic module according to a second embodiment of the present disclosure is described with reference to FIGS. 30 and 31. The electronic module according to the second embodiment is a module that includes the semiconductor device according to the first embodiment and achieves a predetermined function.

2.1. Configuration Example of Electronic Module

First, a configuration of an electronic module 10 according to the present embodiment is described with reference to FIG. 30. FIG. 30 is a cross-sectional diagram schematically illustrating a cross-sectional structure of the electronic module 10 according to the present embodiment.

Figure 30:
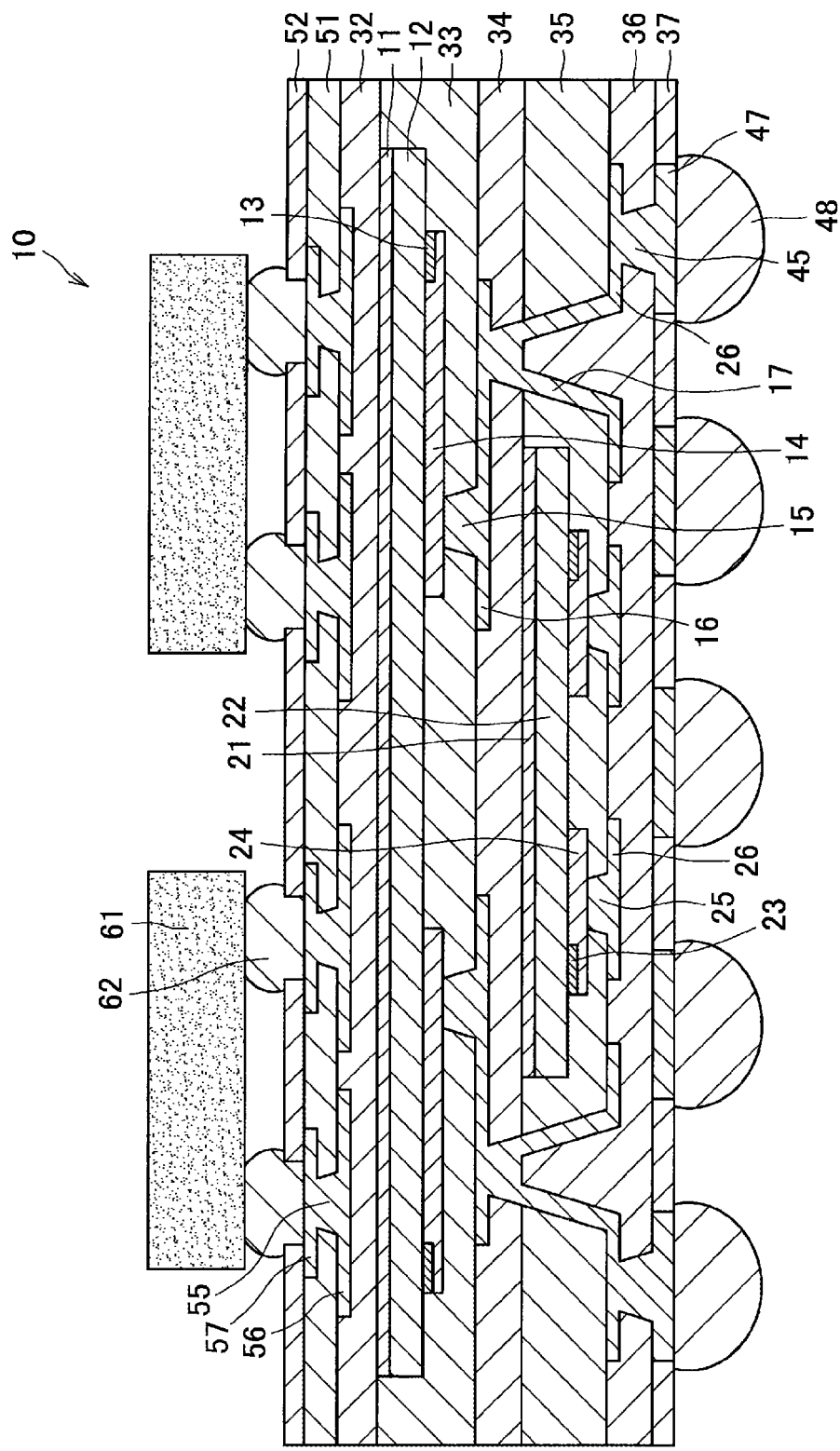
FIG. 30 is a cross-sectional diagram schematically illustrating a cross-sectional structure of an electronic module according to a second embodiment of the present disclosure.

As illustrated in FIG. 30, the electronic module 10 according to the second embodiment has a structure in which an electronic component 61 is installed on the bump terminal 57 of the semiconductor device 1A according to the first advanced example of the first embodiment, with a connection terminal 62 or the like therebetween. Note that configurations described using FIG. 5A are substantially similar, and therefore are not described here.

The electronic component 61 may be a type of sensor that outputs a signal, may be a passive component that consumes, accumulates, or releases supplied electric power, or may be an active component that uses supplied electric power as an input signal and converts it to a different output signal. In addition, the electronic component 61 may be MEMS or the like. Specifically, the electronic component 61 may be a type of sensor such as an image sensor, a passive component such as a resistor, a transformer, and a capacitor, MEMS, and the like.

The connection terminal 62 electrically connects the electronic component 61 to the semiconductor device 1A via the bump terminal 57. Like the external connection terminal 48, the connection terminal 62 may be a solder ball constituting a BGA, a Cu-core solder ball for three-dimensional mounting such as POP, a Cu pillar bump obtained by capping columnar copper with solder, an electrode terminal constituting a LGA, or the like.

In the electronic module 10 according to the present embodiment, the electronic component 61 can be installed on the other surface that is opposite to the one surface provided with the external connection terminal 48. This enables the electronic module 10 to be further reduced in size, as compared with the case where the electronic component 61 is packaged separately and arranged in parallel with the semiconductor device 1A.

2.2. Modified Example

Now, an electronic module according to a modified example of the present embodiment will be described with reference to FIG. 31. FIG. 31 is a cross-sectional diagram schematically illustrating a cross-sectional structure of an electronic module 10A according to the modified example of the present embodiment.

Figure 31:
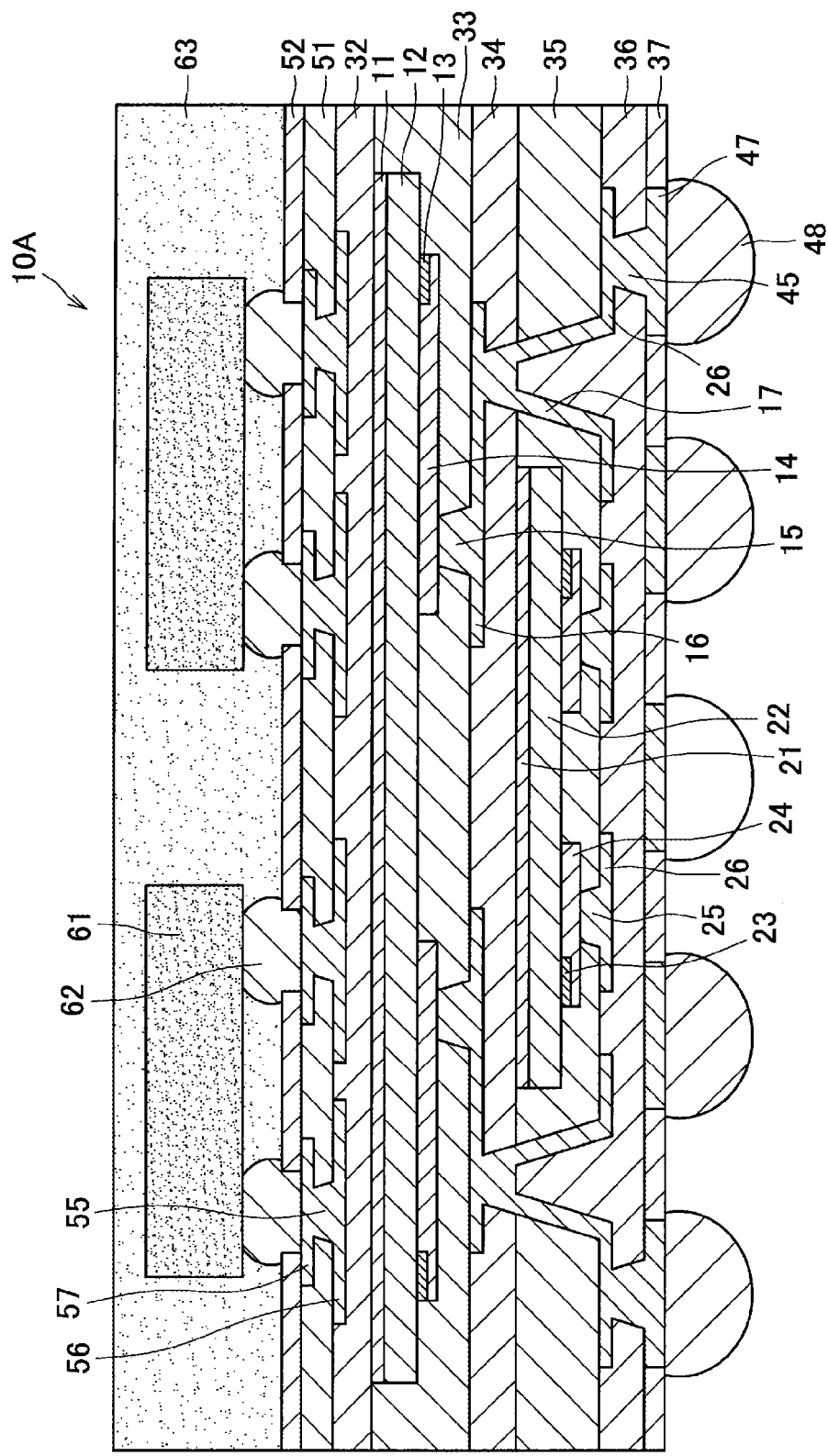
FIG. 31 is a cross-sectional diagram schematically illustrating a cross-sectional structure of an electronic module according to a modified example of the embodiment.

As illustrated in FIG. 31, the electronic module 10A according to the present modified example differs from the electronic module 10 illustrated in FIG. 30 in that a sealing material layer 63 that seals the electronic component 61 is provided. This enables the electronic module 10A to protect the electronic component 61 from external environment and can improve the strength of the electronic module 10A itself.

The sealing material layer 63 protects the electronic component 61 from external environment, and also prevents the electronic component 61 from dropping off the semiconductor device 1A. Specifically, the sealing material layer 63 can be formed, by a transfer mold method, using an organic resin with insulating properties such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin. In addition, the sealing material layer 63 may be formed using one type of the above organic resins alone, or may be formed using a plurality of types of the above organic resins mixed or reacted.

Here, a gap between the connection terminals 62 that connect the electronic component 61 to the semiconductor device 1A is preferably filled with the sealing material layer 63. This can further improve the strength of the electronic module 10A, which can prevent formation of a crack or the like in the connection terminal 62 when the electronic module 10A is mounted on another substrate or the like, and suppress occurrence of connection failure at the connection terminal 62. Note that the gap between the connection terminals 62 may be filled with an organic resin forming the sealing material layer 63, or may be filled by additionally using a capillary underfill sealing material.

3. Third Embodiment

Now, an electronic apparatus according to a third embodiment of the present disclosure will be described with reference to FIGS. 32 and 33. The electronic apparatus according to the third embodiment is an electronic apparatus including the semiconductor device according to the first embodiment or the electronic module according to the second embodiment.

(3.1. Appearance Example of Electronic Apparatus)

First, an overview of an electronic apparatus 100 according to the present embodiment is described with reference to FIG. 32. FIG. 32 is a perspective view of an appearance example of the electronic apparatus 100 according to the present embodiment.

Figure 32:
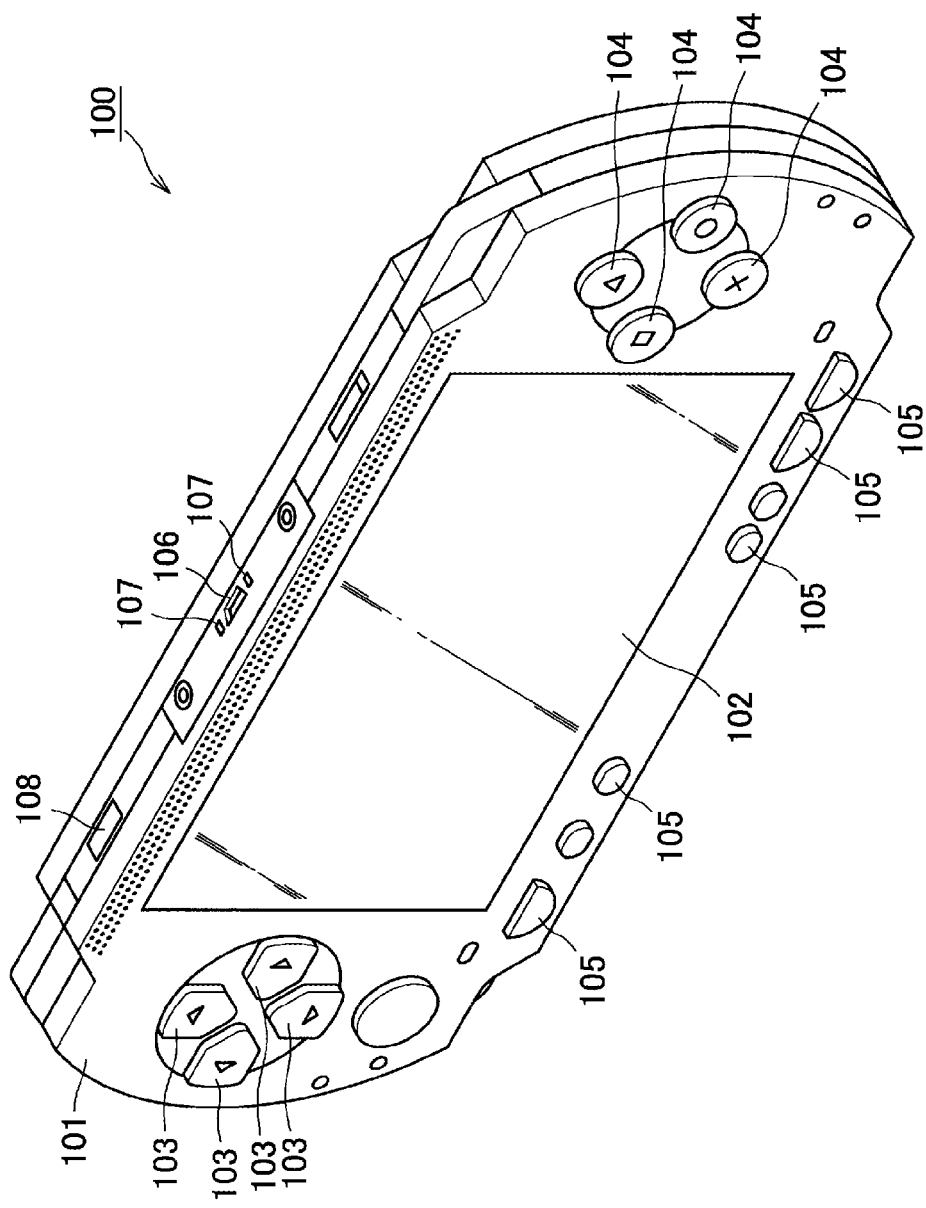
FIG. 32 is a perspective view of an appearance example of an electronic apparatus according to a third embodiment of the present disclosure.

As illustrated in FIG. 32, the electronic apparatus 100 has an appearance in which, for example, configurations are arranged inside and outside a casing 101 formed with a flat shape that is long sideways. The electronic apparatus 100 may be, for example, an apparatus that is used as a game console.

On a front face of the casing 101, a display panel 102 is provided at the center in a longitudinal direction. In addition, on the left and right of the display panel 102 are provided operation keys 103 and operation keys 104 each arranged isolated in a circumferential direction. In addition, a lower end of the front face of the casing 101 is provided with operation keys 105. The operation keys 103, 104, and 105 function as direction keys, decision keys, or the like, and are used for selection of menu items displayed on the display panel 102, progress of a game, and the like.

In addition, a top face of the casing 101 is provided with a connection terminal 106 for connecting an external apparatus, a supply terminal 107 for electric power supply, a light-receiving window 108 to perform infrared communication with an external apparatus, and the like.

(3.2. Configuration Example of Electronic Apparatus)

Next, a circuit configuration of the electronic apparatus 100 is described with reference to FIG. 33. FIG. 33 is a block diagram illustrating a configuration of the electronic apparatus 100 according to the present embodiment.

Figure 33:
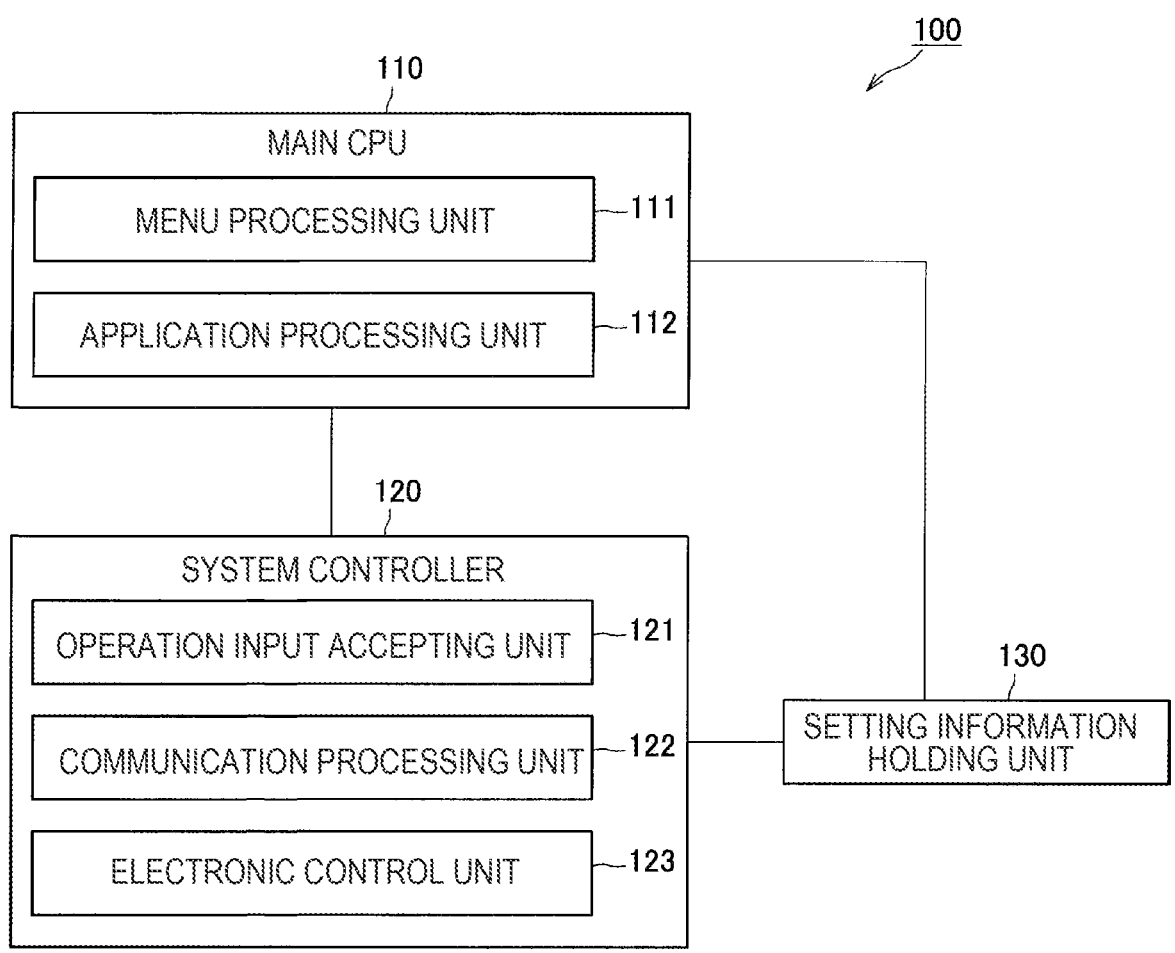
FIG. 33 is a block diagram illustrating a configuration of the electronic apparatus according to the embodiment.

As illustrated in FIG. 33, the electronic apparatus 100 includes a main central processing unit (CPU) 110 and a system controller 120. Electric power is supplied to the main CPU 110 and the system controller 120 by a different system from a battery or the like (not illustrated), for example.

The main CPU 110 includes a menu processing unit 111 that generates a menu screen for causing a user to set various types of information or select an application, and an application processing unit 112 that executes an application.

In addition, the electronic apparatus 100 includes a setting information holding unit 130, such as a memory, that holds various types of information set by the user. Information set by the user is sent to the setting information holding unit 130 by the main CPU 110, and the setting information holding unit 130 holds the sent information.

The system controller 120 includes an operation input accepting unit 121, a communication processing unit 122, and an electric power control unit 123. The operation input accepting unit 121 detects states of the operation keys 103, 104, and 105. In addition, the communication processing unit 122 performs communication processing with an external apparatus, and the electric power control unit 123 controls electric power supplied to each unit of the electronic apparatus 100.

Note that the semiconductor device according to the first embodiment or the electronic module according to the second embodiment is installed on at least one of the main CPU 110, the system controller 120, and the setting information holding unit 130. Using the semiconductor device according to the first embodiment or the electronic module according to the second embodiment can further reduce the size and thickness of the electronic apparatus 100.

4. Conclusion

As described above, a plurality of active components can be stacked with an efficient arrangement inside the semiconductor device 1 according to the first embodiment of the present disclosure. Consequently, the semiconductor device 1 according to the first embodiment of the present disclosure can be reduced in size and thickness, as compared with another semiconductor device in which active components having the same sizes are used.

In addition, in the semiconductor device 1 according to the first embodiment of the present disclosure, the connection via 17 that electrically connects the first active component 12 to the external connection terminal 48 is provided perpendicularly to a board surface of the semiconductor device 1. Thus, the connection via 17 can shorten a wiring length from the first active component 12 to the external connection terminal 48, and thus can reduce a loss due to parasitic capacitance and resistance variation in a transmission line. Such a semiconductor device 1 can be suitably used for a radio-frequency communication module that uses a frequency of a millimeter wave band or a subterahertz wave band.

In addition, in the electronic module 10 according to the second embodiment of the present disclosure, the bump terminal 57 can be provided on the other surface that is opposite to the one surface provided with the external connection terminal 48, and an electronic component that is electrically connected to the bump terminal 57 can be further installed. Consequently, according to the electronic module 10 according to the second embodiment of the present disclosure, another electronic component can be further installed to be stacked, so that a further reduction in size can be achieved.

Furthermore, using the semiconductor device 1 or the electronic module 10 described above enables the electronic apparatus 100 according to the third embodiment of the present disclosure to be further reduced in size.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

In addition, it is needless to say that appropriate combinations of the elements described in the present disclosure will come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor device including:

a multilayer wiring board one surface of which is provided with an external connection terminal; and a plurality of active components that are provided to be stacked inside the multilayer wiring board and are connected to the external connection terminal via a connection via, in which the plurality of active components include a first active component provided on another surface side that is opposite to the one surface, and a second active component that is provided closer to the one surface than the first active component is and has a smaller planar area than the first active component.

(2)

The semiconductor device according to (1), in which the second active component is provided in a projection region of the first active component in a stacking direction.

(3)

The semiconductor device according to (1) or (2), in which the connection via that connects the first active component to the external connection terminal is provided in a projection region of the first active component in a stacking direction to be isolated from the second active component.

(4)

The semiconductor device according to any one of (1) to (3), in which the plurality of active components further include a third active component that is provided closer to the one surface than the first active component is and has a smaller planar area than the first active component, and the third active component is provided in parallel with the first active component in a projection region of the first active component in a stacking direction.

(5)

The semiconductor device according to any one of (1) to (4), in which at least one or more of the plurality of active components is a processor.

(6)

The semiconductor device according to any one of (1) to (5), in which the connection via is provided perpendicularly to a board surface of the multilayer wiring board.

(7)

The semiconductor device according to any one of (1) to (6), in which metal wiring is provided between the first active component and the second active component, and the metal wiring electromagnetically shields the first active component and the second active component from each other.

(8)

An electronic module including a semiconductor device including a multilayer wiring board one surface of which is provided with an external connection terminal, and a plurality of active components that are provided to be stacked inside the multilayer wiring board and are connected to the external connection terminal via a connection via, in which the plurality of active components provided in the semiconductor device include a first active component provided on another surface side that is opposite to the one surface, and a second active component that is provided closer to the one surface than the first active component is and is smaller than the first active component.

(9)

The electronic module according to (8), in which a bump terminal is further provided on the other surface, and an electronic component is provided on the bump terminal.

(10)

The electronic module according to (9), further including a sealing material layer that seals the electronic component.

(11)

An electronic apparatus including a semiconductor device including a multilayer wiring board one surface of which is provided with an external connection terminal, and a plurality of active components that are provided to be stacked inside the multilayer wiring board and are connected to the external connection terminal via a connection via, in which the plurality of active components provided in the semiconductor device include a first active component provided on another surface side that is opposite to the one surface, and a second active component that is provided closer to the one surface than the first active component is and is smaller than the first active component.

(12)

A method for producing a semiconductor device, including:

a step of forming a multilayer wiring board by stacking a plurality of active components on a support substrate while embedding the plurality of active components in an insulating resin;

a step of forming a connection via to be connected to each of the plurality of active components;

a step of forming an electrode pad to be connected to the connection via on a surface of the multilayer wiring board; and a step of forming an external connection terminal on the electrode pad, in which the plurality of active components include a first active component stacked on the support substrate side and a second active component that is stacked on a surface side where the external connection terminal is formed and has a larger planar area than the first active component.

(13)

The method for producing a semiconductor device according to (12), further including a step of peeling off the support substrate from the multilayer wiring board after the formation of the electrode pad.

(14)

The method for producing a semiconductor device according to (12) or (13), in which a via hole in which the connection via is provided is formed by laser processing or photoetching.

REFERENCE SIGNS LIST 1, 1A, 1B semiconductor device
10, 10A electronic module
12 first active component
15, 25, 45, 55 contact via
16, 26, 56 wiring layer
17 connection via
22 second active component
32, 33, 34, 35, 36, 51 interlayer insulating film
47 electrode pad
48 external connection terminal
31, 37, 52 protective layer
57 bump terminal
61 electronic component
62 connection terminal
63 sealing material layer
81 support substrate
82 adhesive resin layer
83 carrier copper foil
84 ultrathin copper foil
100 electronic apparatus

What is claimed is:

1. A semiconductor device comprising:
    a multilayer wiring board, wherein an external connection terminal is provided on a first surface of the multilayer wiring board; and
    a plurality of active components that are stacked inside the multilayer wiring board and are connected to the external connection terminal via a connection via,
    wherein the plurality of active components include a first active component and a second active component, wherein the first active component is bonded to a first interlayer insulating film via a first bonding layer,
wherein the connection via penetrates at least one interlayer insulating film and is provided completely in a projection region of the first active component, and
wherein at least one or more of the plurality of active components is a processor.

2. The semiconductor device according to claim 1, wherein metal wiring is provided between the first active component and the second active component, and wherein the metal wiring electromagnetically shields the first active component and the second active component from each other.

3. The semiconductor device according to claim 2, wherein the metal wiring is embedded in one or more interlayer insulating films.

4. The semiconductor device according to claim 1, wherein the at least one or more of the plurality of active components that is the processor performs an active operation comprising at least one of: amplification or rectification of supplied electric power.

5. The semiconductor device according to claim 1, wherein the at least one or more of the plurality of active components that is the processor comprises a micro processing unit (MPU).

6. The semiconductor device according to claim 1, wherein the at least one or more of the plurality of active components that is the processor comprises a power management integrated circuit (PMIC).

7. The semiconductor device according to claim 1, wherein the at least one or more of the plurality of active components that is the processor comprises an authentication chip.

8. The semiconductor device according to claim 1, wherein the at least one or more of the plurality of active components that is the processor comprises synchronized dynamic random-access memory (SDRAM).

9. The semiconductor device according to claim 1, wherein the external connection terminal comprises a Copper (Cu) core solder ball.

10. The semiconductor device according to claim 1, wherein the external connection terminal comprises a Copper (Cu) pillar bump.

11. The semiconductor device according to claim 1, wherein the external connection terminal comprises an electrode terminal.

12. The semiconductor device according to claim 1, wherein the second active component is bonded to a second interlayer insulating film via a second bonding layer.

13. The semiconductor device according to claim 1, wherein an electrode pad is between the external connection terminal and the connection via.

14. The semiconductor device according to claim 1, further comprising:
a first electrode that performs input/output to the first active component.

15. The semiconductor device according to claim 14, further comprising:
a second electrode that performs input/output to the second active component.

16. An electronic module comprising:
a semiconductor device including:
a multilayer wiring board, wherein an external connection terminal is provided on a first surface of the multilayer wiring board; and
a plurality of active components that are stacked inside the multilayer wiring board and are connected to the external connection terminal via a connection via,
wherein the plurality of active components include a first active component and a second active component,
wherein the first active component is bonded to a first interlayer insulating film via a first bonding layer,
wherein the connection via penetrates at least one interlayer insulating film and is provided completely in a projection region of the first active component, and
wherein at least one or more of the plurality of active components is a processor.

17. The electronic module according to claim 16, wherein a bump terminal is further provided, and wherein an electronic component is provided on the bump terminal.

18. The electronic module according to claim 17, further comprising:
a sealing material layer that seals the electronic component.

19. An electronic apparatus comprising:
a semiconductor device including:
a multilayer wiring board, wherein an external connection terminal is provided on a first surface of the multilayer wiring board; and
a plurality of active components that are stacked inside the multilayer wiring board and are connected to the external connection terminal via a connection via,
wherein the plurality of active components include a first active component and a second active component,
wherein the first active component is bonded to a first interlayer insulating film via a first bonding layer,
wherein the connection via penetrates at least one interlayer insulating film and is provided completely in a projection region of the first active component, and
wherein at least one or more of the plurality of active components is a processor.

* * * * *